US010880662B2

(12) United States Patent
Kennes

(10) Patent No.: US 10,880,662 B2
(45) Date of Patent: Dec. 29, 2020

(54) RETENTION MAGNET SYSTEM FOR MEDICAL DEVICE

(71) Applicant: Cochlear Limited, Macquarie University (AU)

(72) Inventor: Patrik Kennes, Macquarie University (AU)

(73) Assignee: Cochlear Limited, Macquarie University (AU)

( * ) Notice: Subject to any disclaimer, the term of this patent is extended or adjusted under 35 U.S.C. 154(b) by 0 days.

(21) Appl. No.: 15/919,717

(22) Filed: Mar. 13, 2018

(65) Prior Publication Data

US 2018/0270591 A1 Sep. 20, 2018

Related U.S. Application Data

(63) Continuation of application No. PCT/IB2016/001388, filed on Sep. 13, 2016, which is (Continued)

(51) Int. Cl.
*H04R 25/00* (2006.01)

(52) U.S. Cl.
CPC ........... *H04R 25/606* (2013.01); *H04R 25/60* (2013.01); *H05K 999/99* (2013.01); *H04R 2225/67* (2013.01); *H04R 2460/13* (2013.01)

(58) Field of Classification Search
CPC ... A61F 2/18; A61F 11/04; A61N 1/36; A61N 1/37223; G01R 33/02; H04R 2225/67; H04R 2460/13; H04R 25/00; H04R 25/02; H04R 25/60; H04R 25/604; H04R 25/606; H05K 999/99; A61M 5/172; A61M 5/14248; A61B 17/70; A61B 17/7004; A61L 24/06; H02J 7/00
USPC ........ 264/279; 381/324, 326, 312, 323, 151; 600/12, 25, 37; 607/43, 57, 60, 149, 62, 607/33, 55, 61; 128/899; 324/252, 319;

(Continued)

(56) References Cited

U.S. PATENT DOCUMENTS

| | | |
|---|---|---|
| 4,352,960 A | 10/1982 | Dormer |
| 4,792,368 A | 12/1988 | Sagawa |

(Continued)

FOREIGN PATENT DOCUMENTS

| | | |
|---|---|---|
| JP | 2010-075394 | 4/2010 |

OTHER PUBLICATIONS

International Search Report and Written Opinion for PCT/IB2016/001388, dated Feb. 8, 2017, 15 pages.

(Continued)

*Primary Examiner* — Gerald Gauthier
(74) *Attorney, Agent, or Firm* — Pilloff Passino & Cosenza LLP; Martin J. Cosenza

(57) ABSTRACT

An external portion of an auditory prosthesis includes an external magnet that interacts with an implantable magnet to hold the external portion against the skin. Magnetic force generated by the stray field of these magnets can disturb the operation of a vibrating element of the auditory prosthesis. The technologies described herein utilize additional magnets disposed within portions of the auditory prosthesis to redirect the magnetic flux, which allows the vibrating element to be disposed more closely to the magnets, reducing the overall height profile of the prosthesis.

17 Claims, 28 Drawing Sheets

Related U.S. Application Data a continuation of application No. 15/158,225, filed on May 18, 2016, now Pat. No. 9,872,115.

(60) Provisional application No. 62/218,339, filed on Sep. 14, 2015.

(58) Field of Classification Search
USPC .............. 335/306; 623/2.27, 10, 11.11, 2.37; 604/288.01; 359/199.3, 824; 360/324.1; 365/162
See application file for complete search history.

(56) References Cited

U.S. PATENT DOCUMENTS 5,423,317 A 6/1995 Iijima
5,746,897 A 5/1998 Heimanson
6,643,378 B2 * 11/2003 Schumaier ........... H04R 25/606 381/318
7,191,007 B2 * 3/2007 Desai ................... A61N 1/3787 607/33
7,762,998 B2 * 7/2010 Birk ..................... A61B 17/064 604/288.01
8,246,533 B2 * 8/2012 Chang .................. A61B 17/064 600/37
9,002,469 B2 * 4/2015 D'Ambrosio ......... A61M 1/127 607/61
9,014,782 B2 4/2015 Miyoshi
9,022,917 B2 * 5/2015 Kasic ................... H04R 25/606 600/25
9,042,995 B2 * 5/2015 Dinsmoor .............. A61N 1/378 607/60
9,136,728 B2 * 9/2015 Dinsmoor ............. H02J 7/0004
9,179,228 B2 * 11/2015 Ruppersberg ........ H04R 25/606
9,210,521 B2 * 12/2015 Kasic ................... H04R 25/606
9,258,656 B2 2/2016 Ruppersberg
9,526,810 B2 * 12/2016 Ruppersberg ........... A61L 24/06
9,736,601 B2 * 8/2017 Kasic ................... H04R 25/606
9,739,842 B2 8/2017 Holm
9,788,125 B2 * 10/2017 Ruppersberg ........ H04R 25/453
9,872,115 B2 1/2018 Kennes
10,405,891 B2 * 9/2019 Pool ................... A61B 17/7016
2002/0120332 A1 * 8/2002 Law ..................... A61N 1/0526 623/11.11
2003/0034039 A1 * 2/2003 Schmid ............... A61M 1/1698 128/899
2003/0171792 A1 * 9/2003 Zarinetchi ............ A61N 1/3787 607/61
2004/0032962 A1 * 2/2004 Westerkull ........... H04R 25/606 381/151
2004/0136558 A1 7/2004 Usuki
2004/0260362 A1 * 12/2004 Darley ..................... A61N 1/08 607/57
2005/0185346 A1 * 8/2005 Shoji .................... G01R 15/205 360/324.1
2006/0002031 A1 * 1/2006 Shoji ...................... G11B 5/127 360/313
2006/0045298 A1 * 3/2006 Westerkull ............. H02K 33/18 381/326
2006/0056649 A1 * 3/2006 Schumaier ........... H04R 25/606 381/326
2006/0084857 A1 4/2006 Massengill
2006/0119356 A1 * 6/2006 Rabe ...................... B82Y 25/00 324/252
2006/0241746 A1 * 10/2006 Shaoulian ............. A61F 2/2451 623/2.37
2007/0053536 A1 * 3/2007 Westerkull ........... H04R 25/606 381/326
2008/0009920 A1 * 1/2008 Gibson .................... A61N 1/08 607/57
2009/0138062 A1 * 5/2009 Balslev .................. A61B 5/123 607/55
2009/0237080 A1 * 9/2009 Kato .................. G01R 33/3873 324/319
2009/0248155 A1 * 10/2009 Parker .................... H04R 25/70 623/10
2009/0251830 A1 * 10/2009 Kurata ................... G01R 33/09 360/324
2010/0019626 A1 * 1/2010 Stout ........................ H02K 1/02 310/60 A
2010/0219712 A1 9/2010 Kogure
2010/0292759 A1 * 11/2010 Hahn ..................... A61N 1/375 607/57
2011/0112607 A1 * 5/2011 Zierhofer ............. A61N 1/3787 607/57
2011/0224789 A1 * 9/2011 Griffith .............. A61N 1/37229 623/10
2011/0268303 A1 * 11/2011 Ahsani ................... H04R 11/02 381/326
2011/0285488 A1 * 11/2011 Scott ..................... H01F 7/0221 335/306
2011/0291507 A1 12/2011 Post
2012/0062992 A1 3/2012 Kimoto
2012/0095283 A1 * 4/2012 Andersson ........... H04R 25/606 600/25
2012/0296155 A1 * 11/2012 Ball ..................... A61N 1/3718 600/25
2013/0018218 A1 * 1/2013 Haller .................... H04R 25/60 600/25
2013/0110198 A1 5/2013 Stoffaneller
2013/0165738 A1 * 6/2013 Ball ....................... H04R 25/02 600/25
2013/0195304 A1 * 8/2013 Andersson ........... H04R 25/606 381/326
2013/0202140 A1 * 8/2013 Asnes .................... H04R 9/025 381/326
2013/0229698 A1 * 9/2013 Honda ................. G02B 26/105 359/199.3
2013/0278254 A1 10/2013 Reeder
2014/0012071 A1 * 1/2014 Nagl ...................... A61N 1/375 600/25
2014/0012349 A1 * 1/2014 Zimmerling ....... A61N 1/37229 607/57
2014/0094876 A1 * 4/2014 Wingeier ........... A61N 1/36128 607/62
2014/0163309 A1 * 6/2014 Bernhard ............. H04R 25/606 600/25
2014/0292321 A1 10/2014 Yamazaki
2014/0321681 A1 * 10/2014 Ball ....................... H04R 25/00 381/312
2014/0336447 A1 * 11/2014 Bjorn ................... H04R 25/606 600/25
2014/0343626 A1 * 11/2014 Thenuwara ............ A61N 1/375 607/57
2014/0364681 A1 * 12/2014 Hillbratt ................ H04R 25/30 600/25
2014/0364682 A1 * 12/2014 Hillbratt .............. H04R 25/353 600/25
2015/0032186 A1 * 1/2015 Cushing ............. A61N 1/36036 607/57
2015/0043273 A1 * 2/2015 Naaman .............. G11C 11/1675 365/162
2015/0063611 A1 * 3/2015 Hillbratt .............. H04R 25/456 381/312
2015/0092969 A1 * 4/2015 Meskens .............. H04R 25/606 381/323
2015/0160426 A1 * 6/2015 Chao ........................ G03B 3/10 359/824
2015/0160470 A1 6/2015 Terajima
2015/0192432 A1 7/2015 Noguchi
2015/0382114 A1 * 12/2015 Andersson ........... H04R 25/606 600/25
2016/0037273 A1 * 2/2016 Gustafsson .......... H04R 25/606 600/25
2016/0058555 A1 * 3/2016 Andersson ........... H04R 25/606 623/10
2016/0161288 A1 6/2016 Lu
2016/0234613 A1 * 8/2016 Westerkull ........... H04R 25/606
2016/0381473 A1 * 12/2016 Gustafsson .......... H04R 25/606 600/25

(56) References Cited

U.S. PATENT DOCUMENTS

| | | | | |
|---|---|---|---|---|
| 2017/0078808 | A1* | 3/2017 | Kennes | H04R 25/606 |
| 2017/0216523 | A1* | 8/2017 | Neftel | A61M 5/14248 |
| 2018/0352349 | A1* | 12/2018 | Fung | H04R 25/65 |

OTHER PUBLICATIONS

International Preliminary Report on Patentability for PCT/IB2016/001388, dated Mar. 20, 2018, 12 pages.

* cited by examiner

RETENTION MAGNET SYSTEM FOR MEDICAL DEVICE

This application is a continuation of PCT International Patent Application No. PCT/IB2016/001388, filed on Sep. 13, 2016, which claims priority to U.S. Provisional Patent Application Ser. No. 62/218,339, filed Sep. 14, 2015, and which is a continuation of U.S. Utility Patent Application Ser. No. 15/158,225, filed May 18, 2016, now U.S. Pat. No. 9,872,115. The entire disclosures of these foregoing applications are incorporated by reference in their entirety.

BACKGROUND

Hearing loss, which can be due to many different causes, is generally of two types: conductive and sensorineural. Sensorineural hearing loss is due to the absence or destruction of the hair cells in the cochlea that transduce sound signals into nerve impulses. Various hearing prostheses are commercially available to provide individuals suffering from sensorineural hearing loss with the ability to perceive sound. For example, cochlear implants use an electrode array implanted in the cochlea of a recipient (i.e., the inner ear of the recipient) to bypass the mechanisms of the middle and outer ear. More specifically, an electrical stimulus is provided via the electrode array to the auditory nerve, thereby causing a hearing percept.

Conductive hearing loss occurs when the normal mechanical pathways that provide sound to hair cells in the cochlea are impeded, for example, by damage to the ossicular chain, the ear drum or the ear canal. Individuals suffering from conductive hearing loss can retain some form of residual hearing because some or all of the hair cells in the cochlea function normally.

Individuals suffering from conductive hearing loss often receive a conventional hearing aid. Such hearing aids rely on principles of air conduction to transmit acoustic signals to the cochlea. In particular, a hearing aid typically uses an arrangement positioned in the recipient's ear canal or on the outer ear to amplify a sound received by the outer ear of the recipient. This amplified sound reaches the cochlea causing motion of the perilymph and stimulation of the auditory nerve.

In contrast to conventional hearing aids, which rely primarily on the principles of air conduction, certain types of hearing prostheses commonly referred to as bone conduction devices, convert a received sound into vibrations. The vibrations are transferred through the skull to the cochlea causing motion of the perilymph and stimulation of the auditory nerve, which results in the perception of the received sound. Bone conduction devices are suitable to treat a variety of types of hearing loss and can be suitable for individuals who cannot derive sufficient benefit from conventional hearing aids.

SUMMARY

An external portion of an auditory prosthesis includes an external magnet that interacts with an implantable magnet to hold the external portion against the skin. The stray magnetic field generated by these magnets can disturb the operation of a vibrating element of the auditory prosthesis. The technologies described herein utilize additional magnets disposed within portions of the auditory prosthesis to redirect the magnetic flux, which allows the vibrating element to be disposed more closely to the magnets, reducing the overall height profile of the prosthesis. Additionally, this can result in greater magnetic retention forces, which can allow smaller magnets to be utilized.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

DETAILED DESCRIPTION

Figure 1A:
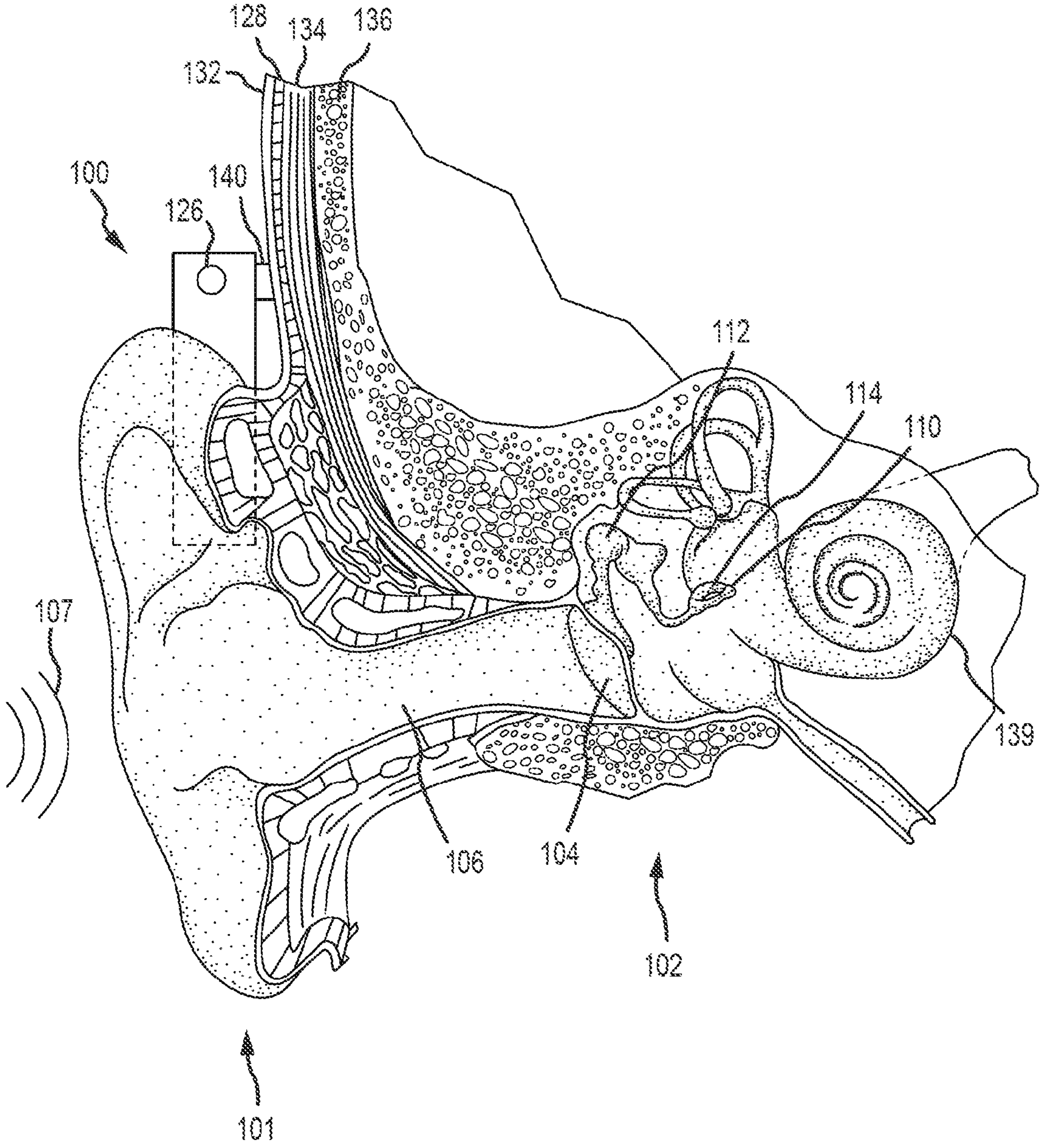
FIG. 1A depicts a partial perspective view of a percutaneous bone conduction device worn on a recipient.

The technologies described herein can be utilized in auditory prostheses such as passive transcutaneous bone conduction devices, active transcutaneous bone conduction devices, cochlear implants, or direct acoustic stimulators. There are typically one or two magnets disposed in an external portion and/or implantable portion of the auditory prosthesis. The magnetic field of the external magnet(s) interacts with a magnetic field of the magnet(s) disposed in an implantable portion of the prosthesis. Other types of auditory prostheses, such as middle ear prostheses, and direct acoustic stimulators utilize a similar configuration where an external magnet mates with an implantable magnet to hold the external portion to the skin. In another example, a percutaneous bone conduction prosthesis utilizes an anchor that penetrates the skin of the head. An external portion of the auditory prosthesis is secured to the anchor with a snap connection. By utilizing the technologies described herein, the anchor can be manufactured in whole or in part of a magnetic material, and a mating magnet group can be disposed in the external portion to mate with the anchor, either alone, or also in conjunction with a snap connection. Moreover, the technologies disclosed herein can be utilized with any type of multi-component medical device where one portion of the device is implanted in a recipient, and the other portion is secured to the skin of a patient via a force generated by a magnetic field. For clarity, however, the technologies will be described generally in the context of auditory prostheses that are bone conduction devices, and more specifically transcutaneous bone conduction devices.

Additionally, many of the magnet groups depicted herein are depicted as substantially arc-shaped. Arc-shaped magnets are depicted and described herein so as to enable valid comparisons between magnet groups having different configurations. Regardless, the magnets can be of virtually any form factor or shape, as required or desired for a particular application. Contemplated shapes include rectangular, crescent, triangular, trapezoidal, circle segments, and so on. Additionally, substantially plate-like or flat magnets are disclosed in several embodiments, but magnets having variable thicknesses are also contemplated. Additionally, the magnet groups can be in the form on a single element that has multiple polarities. Different examples of external and implantable magnet groups, as well as performance characteristics thereof, are described in more detail below. The magnets described in the examples herein have shape that can be defined as similar to at least part of a disk (e.g., in whole or in part, having a round outer perimeter with generally flat upper and lower surfaces). In general, for such disk-like magnets, an axially magnetized magnet has one pole on one of the flat surface and a second pole disposed on the opposite flat surface. For such disk-like magnets, a diametrically magnetized magnet has one pole on one hemisphere of the disk, and a second pole disposed on the other hemisphere of the disk. A person of skill in the art would recognize other magnet configurations that would fall within the scope of the described technology.

FIG. 1A depicts a partial perspective view of a percutaneous bone conduction device 100 positioned behind outer ear 101 of the recipient and includes a sound input element 126 to receive sound signals 107. The sound input element 126 can be a microphone, telecoil, or similar. In the present example, sound input element 126 can be located, for example, on or in bone conduction device 100, or on a cable extending from bone conduction device 100. Also, bone conduction device 100 includes a sound processor (not shown), a vibrating electromagnetic actuator and/or various other operational components.

More particularly, sound input device 126 converts received sound signals into electrical signals. These electrical signals are processed by the sound processor. The sound processor generates control signals that cause the actuator to vibrate. In other words, the actuator converts the electrical signals into mechanical force to impart vibrations to skull bone 136 of the recipient.

Bone conduction device 100 further includes coupling apparatus 140 to attach bone conduction device 100 to the recipient. In the example of FIG. 1A, coupling apparatus 140 is attached to an anchor system (not shown) implanted in the recipient. An exemplary anchor system (also referred to as a fixation system) can include a percutaneous abutment fixed to the recipient's skull bone 136. The abutment extends from skull bone 136 through muscle 134, fat 128, and skin 132 so that coupling apparatus 140 can be attached thereto. Such a percutaneous abutment provides an attachment location for coupling apparatus 140 that facilitates efficient transmission of mechanical force.

It is noted that sound input element 126 can include devices other than a microphone, such as, for example, a telecoil, etc. In an exemplary embodiment, sound input element 126 can be located remote in a BTE device (not shown) supported by the ear and in communication with the bone conduction device 100 via a cable. Alternatively, sound input element 126 can be subcutaneously implanted in the recipient, or positioned in the recipient's ear canal or positioned within the pinna. Sound input element 126 can also be a component that receives an electronic signal indicative of sound, such as, from an external audio device. For example, sound input element 126 can receive a sound signal in the form of an electrical signal from an MP3 player or a smartphone electronically connected to sound input element 126.

The sound processing unit of the auditory prosthesis processes the output of the sound input element 126, which is typically in the form of an electrical signal. The processing unit generates control signals that cause an associated actuator to vibrate. These mechanical vibrations are delivered by an external portion of the auditory prosthesis 100, as described below.

Figure 1B:
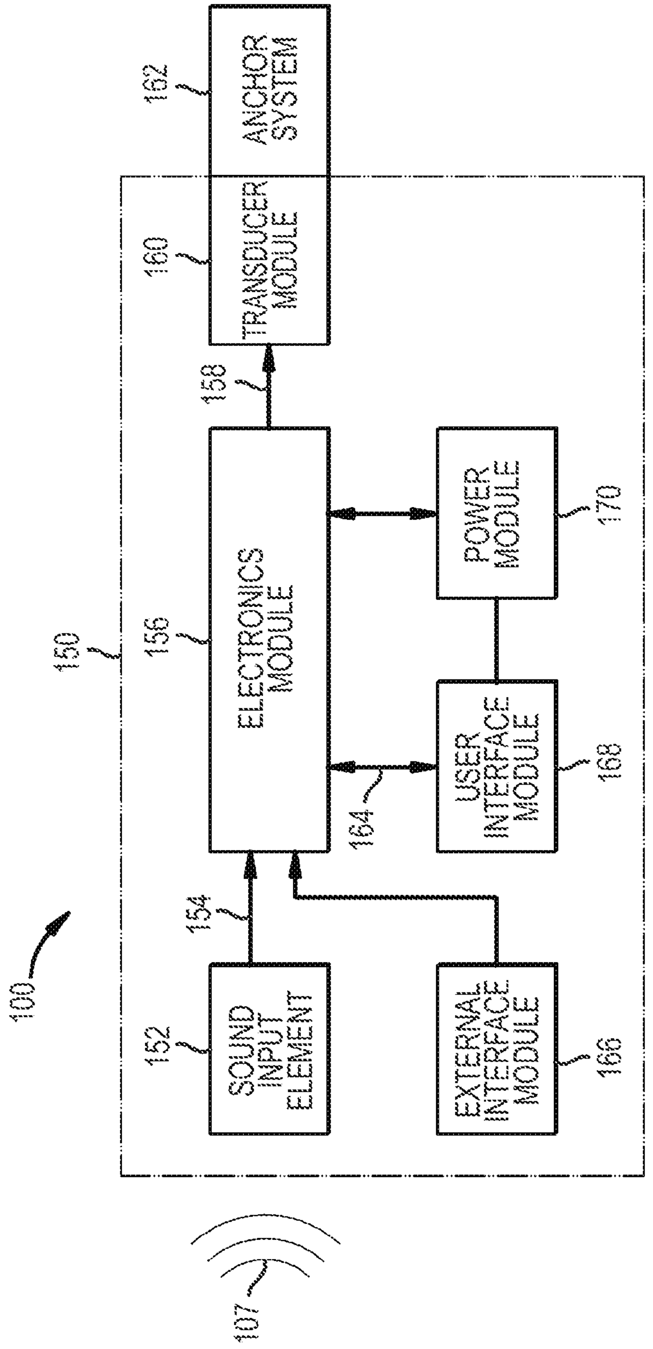
FIG. 1B is a schematic diagram of a percutaneous bone conduction device.

FIG. 1B is a schematic diagram of a percutaneous bone conduction device 100. Sound 107 is received by sound input element 152. In some arrangements, sound input element 152 is a microphone configured to receive sound 107, and to convert sound 107 into electrical signal 154. Alternatively, sound 107 is received by sound input element 152 as an electrical signal. As shown in FIG. 1B, electrical signal 154 is output by sound input element 152 to electronics module 156. Electronics module 156 is configured to convert electrical signal 154 into adjusted electrical signal 158. As described below in more detail, electronics module 156 can include a sound processor, control electronics, transducer drive components, and a variety of other elements.

As shown in FIG. 1B, transducer 160 receives adjusted electrical signal 158 and generates a mechanical output force in the form of vibrations that is delivered to the skull of the recipient via anchor system 162, which is coupled to bone conduction device 100. Delivery of this output force causes motion or vibration of the recipient's skull, thereby activating the hair cells in the recipient's cochlea (not shown) via cochlea fluid motion.

FIG. 1B also illustrates power module 170. Power module 170 provides electrical power to one or more components of bone conduction device 100. For ease of illustration, power module 170 has been shown connected only to user interface module 168 and electronics module 156. However, it should be appreciated that power module 170 can be used to supply power to any electrically powered circuits/components of bone conduction device 100.

User interface module 168, which is included in bone conduction device 100, allows the recipient to interact with bone conduction device 100. For example, user interface module 168 can allow the recipient to adjust the volume, alter the speech processing strategies, power on/off the device, etc. In the example of FIG. 1B, user interface module 168 communicates with electronics module 156 via signal line 164.

Bone conduction device 100 can further include an external interface module 166 that can be used to connect electronics module 156 to an external device, such as a fitting system. Using external interface module 166, the external device, can obtain information from the bone conduction device 100 (e.g., the current parameters, data, alarms, etc.) and/or modify the parameters of the bone conduction device 100 used in processing received sounds and/or performing other functions.

In the example of FIG. 1B, sound input element 152, electronics module 156, transducer 160, power module 170, user interface module 168, and external interface module have been shown as integrated in a single housing, referred to as an auditory prosthesis housing or an external portion housing 150. However, it should be appreciated that in certain examples, one or more of the illustrated components can be housed in separate or different housings. Similarly, it should also be appreciated that in such embodiments, direct connections between the various modules and devices are not necessary and that the components can communicate, for example, via wireless connections.

Figure 2:
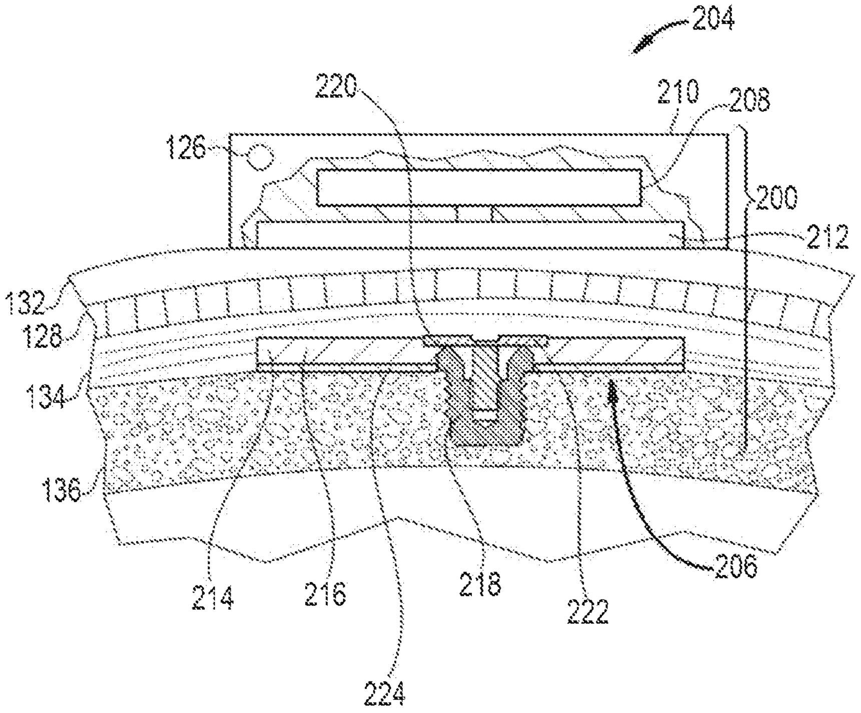
FIG. 2 depicts a cross-sectional schematic view of a passive transcutaneous bone conduction device worn on a recipient.

FIG. 2 depicts an example of a transcutaneous bone conduction device 200 that includes an external portion 204 and an implantable portion 206. The transcutaneous bone conduction device 200 of FIG. 2 is a passive transcutaneous bone conduction device in that a vibrating actuator 208 is located in the external portion 204. Vibrating actuator 208 is located in housing 210 of the external component, and is coupled to plate 212. Plate 212 can be in the form of a permanent magnet, a group of magnets, and/or in another form that generates and/or is reactive to a magnetic field, or otherwise permits the establishment of magnetic attraction between the external portion 204 and the implantable portion 206 sufficient to hold the external portion 204 against the skin of the recipient. Magnetic attraction can be further enhanced by utilization of a magnetic implantable plate 216. A single external magnet 212 of a first polarity and a single implantable magnet 216 of a second polarity, are depicted in FIG. 2. In alternative embodiments, two magnets in both the external portion 204 and implantable portion 206 can be utilized. In a further alternative embodiment the plate 212 can include an additional plastic or biocompatible housing (not shown) that encapsulates plate 212 and contacts the skin of the recipient.

The vibrating actuator 208 is a device that converts electrical signals into vibration. In operation, sound input element 126 converts sound into electrical signals. Specifically, the transcutaneous bone conduction device 200 provides these electrical signals to vibrating actuator 208, or to a sound processor (not shown) that processes the electrical signals, and then provides those processed signals to vibrating actuator 208. The vibrating actuator 208 converts the electrical signals into vibrations. Because vibrating actuator 208 is mechanically coupled to plate 212, the vibrations are transferred from the vibrating actuator 208 to plate 212. Implantable plate assembly 214 is part of the implantable portion 206, and is made of a ferromagnetic material that can be in the form of a permanent magnet, that generates and/or is reactive to a magnetic field, or otherwise permits the establishment of a magnetic attraction between the external portion 204 and the implantable portion 206 sufficient to hold the external portion 204 against the skin 132 of the recipient. Additional details regarding the magnet groups that can be utilized in both the external portion 204 and the implantable portion 206 are described in more detail herein. Accordingly, vibrations produced by the vibrating actuator 208 of the external portion 204 are transferred from plate 212 across the skin 132 to implantable plate 216 of implantable plate assembly 214. This can be accomplished as a result of mechanical conduction of the vibrations through the skin 132, resulting from the external portion 204 being in direct contact with the skin 132 and/or from the magnetic field between the two plates 212, 216. These vibrations are transferred without a component penetrating the skin 132, fat 128, or muscular 134 layers on the head.

As can be seen, the implantable plate assembly 214 is substantially rigidly attached to bone fixture 220 in this embodiment. Implantable plate assembly 214 includes through hole 220 that is contoured to the outer contours of the bone fixture 218, in this case, a bone screw that is secured to the bone 136 of the skull. This through hole 220 thus forms a bone fixture interface section that is contoured to the exposed section of the bone fixture 218. In an exemplary embodiment, the sections are sized and dimensioned such that at least a slip fit or an interference fit exists with respect to the sections. Plate screw 222 is used to secure implantable plate assembly 214 to bone fixture 218. As can be seen in FIG. 2, the head of the plate screw 222 is larger than the hole through the implantable plate assembly 214, and thus the plate screw 222 positively retains the implantable plate assembly 214 to the bone fixture 218. In certain embodiments, a silicon layer 224 is located between the implantable plate 216 and bone 136 of the skull.

Figure 3A:
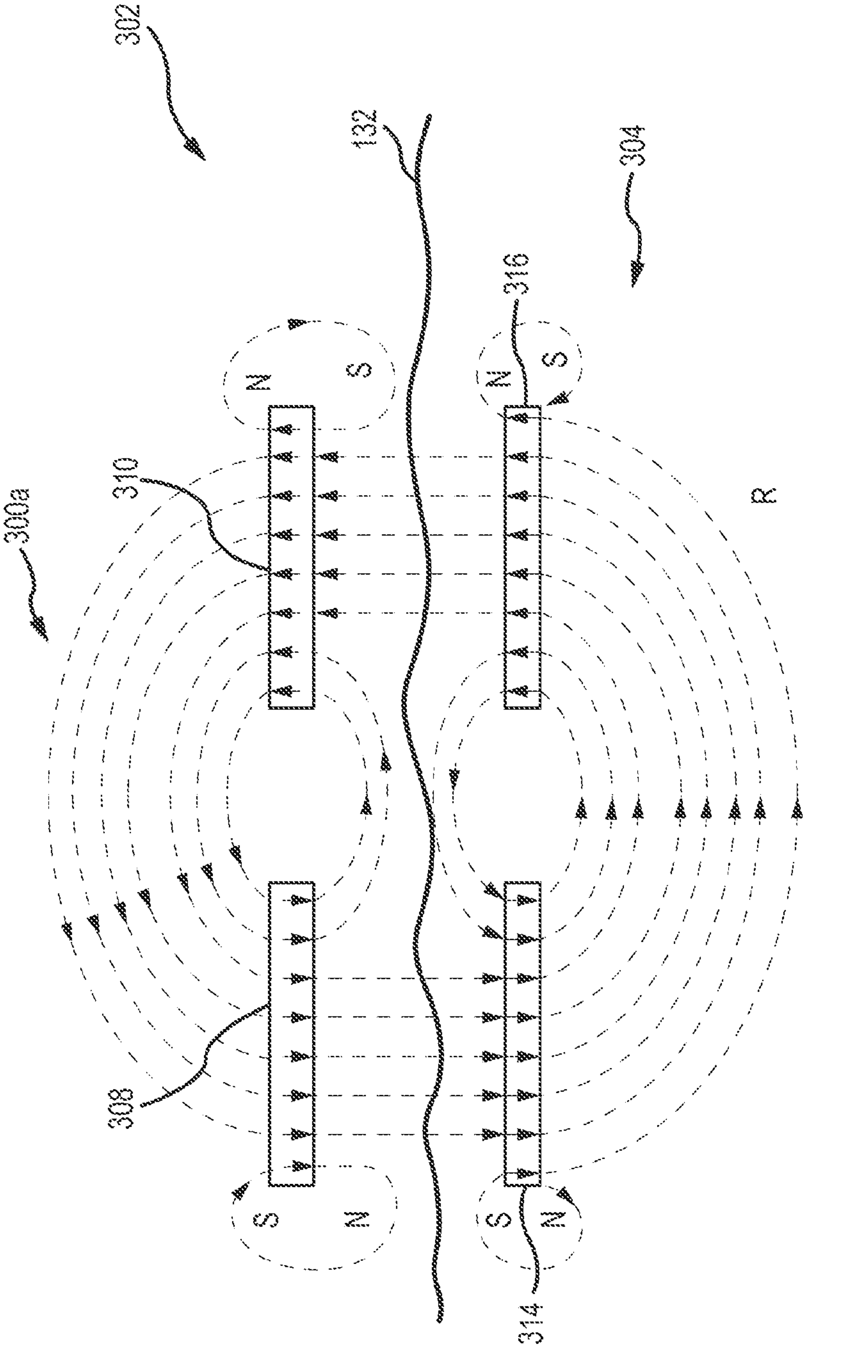
FIG. 3A depicts a partial cross-sectional schematic view of a passive transcutaneous bone conduction device worn on a recipient.

FIG. 3A depicts a partial cross-sectional schematic view of a passive transcutaneous bone conduction device 300*a* for a recipient R. Only skin 132 of the recipient R is depicted for clarity. The bone conduction device 300*a* includes an external portion 302 and an implantable portion 304. For clarity, only certain components of each of the external portion 302 and the implantable portion 304 are depicted. Each of the external portion 302 and the implantable portion 304 include reciprocal groups of magnets that form a transcutaneous coupling between those portions 302, 304, via a closed magnetic circuit. Other components in the external portion 302 and the implantable portion 304, e.g., housings, sound processing components, batteries, microphones, actuators, anchors, etc., are described above, but not depicted in FIG. 3A. The external portion 302 includes a plurality of external magnets 308, 310. In this embodiment, magnet 308 has a magnetization direction (e.g., as defined by the north and south poles thereof) that extends into the skin 132 of the recipient R, while magnet 310 has a magnetization direction that extends away from the skin 132. As such, these magnetization directions are substantially parallel and opposed to each other. In the illustrated example, the implantable portion 304 also includes two magnets 314, 316. Magnet 314 has a magnetization direction that is both substantially parallel to and harmonized with the magnetization direction of magnet 308, while magnet 316 has a magnetization direction that is both substantially parallel to and harmonized with the magnetization direction of magnet 310. The magnets 314, 316 can be disposed in a housing.

Magnetic flux generated by the magnets 308, 310, 314, 316 is also depicted in FIG. 3A. The magnetic field, and especially stray portions thereof, can interfere with the operation of the sound processor or other components disposed in the external portion 302. Stray portions are generally not depicted in FIG. 3A. Forces and/or torques are generated on components disposed in the external portion 302, which can compromise the functionality of the actuator, by affecting the functionality of the actuator suspension, thus leading to worsened feedback performance of the device 300. The performance of the vibrating actuator (if electromagnetic) can also be worsened by stray magnetic fields penetrating the actuator, thus reducing sensitivity and causing distortion.

Figure 3B:
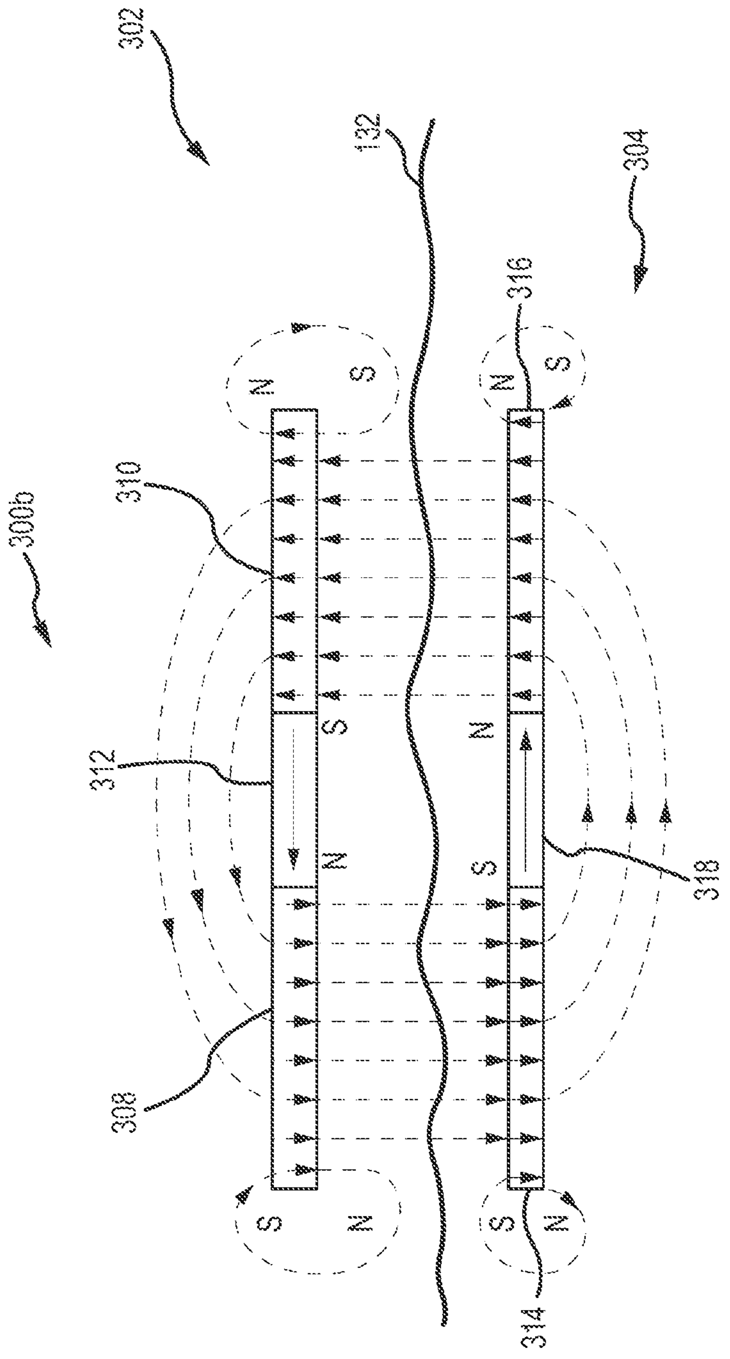
FIG. 3B depicts a partial cross-sectional schematic view of a passive transcutaneous bone conduction device utilizing magnet groups, worn on a recipient.

FIG. 3B depicts a partial cross-sectional schematic view of a passive transcutaneous bone conduction device 300*b* for a recipient R. This device 300*b* utilizes additional magnets 312, 318 to reduce stray magnetic fields and otherwise improve performance. Utilization of magnets 312 and 318 can reduce interferences and further improve functionality of the auditory prosthesis 300*b*. The magnetization direction of magnet 312 is substantially parallel and opposed to magnetization direction of magnet 318. Both of these magnetization directions are substantially parallel to the skin 132. The magnetic components 312, 318 divert the magnetic flux as depicted in FIG. 3B, to reduce the stray magnetic fields, thus correcting or minimizing the above-identified and other problems. Regardless of the number of magnets used, arranging the magnets 312, 318 such that the magnetization directions are in a circuit that defines a substantially continuous magnetic flux path in the medical device. In other words, the magnets 312, 318 create a shortcut for flux on that side of the medical device. As such, each of magnets 308, 310, 312, 314, 316, and 318 define a localized section of the flux path. By creating the circuit of magnetization direction, the magnetic flux is distributed asymmetrically on opposing sides of the medical device. This asymmetrical distribution, in practical terms, results in the retention force on one side of the magnets (e.g., 308 and 310) being increased and the magnetic interference on the other being reduced. Retention force is increased because the depicted arrangement of the magnets produces a flux concentration proximate the skin 132. In the depicted example, magnetic retention force proximate the skin 132 is increased, while magnetic interference away from the skin (e.g., where the sound processor, vibrating actuator, and other components are located) is decreased.

Each magnet in each magnet group generates its own magnetic field. Together, magnets 308, 310, 312, 314, 316, and 318 form a magnet group (and generate a group magnetic field), although subsets of these magnets (e.g., magnets 308, 310, 312 in the external portion 302; and magnets 314, 316, 318 in the implantable portion 304) can also form magnet groups (and their own group magnetic fields). Moreover, the magnets in each magnet group need not be physically separate components, but can be a unitary part having different magnetization directions, which can be accomplished by the magnetization process. The effect on the magnetic field is depicted in FIG. 3B, where the field is channeled through the magnet 312, so as to reduce stray magnetic flux. Of course, magnet 318 channels the field so the stray flux generated by the implantable magnets 314, 316 is also reduced.

Magnets having differing form factors and magnetization directions are contemplated. For example, magnets that are diametrically magnetized and magnets that are axially magnetized are contemplated for applications such as bone conduction devices, to maintain a low profile of the auditory prosthesis. In the depicted embodiment, magnets 308, 310, 314, and 316 are axially magnetized so as to have a magnetization direction normal to a transcutaneous interface (i.e., the interface between the external portion 302 and the implantable portion 304). The magnets 312, 318 are magnetized through the width so as to have a magnetization direction transverse to the magnetization direction of magnets 308, 310, 314, and 316. In examples where a unitary magnet is used, the unitary magnet can be magnetized such that portions thereof are diametrically magnetized, while other portions thereof are axially magnetized. Moreover, each magnet of a given magnet group can physically contact magnets proximate thereto so as to form a continuous flux path within the medical device (or the implanted component), if desired. Other configurations are contemplated and described in more detail below.

Figure 4:
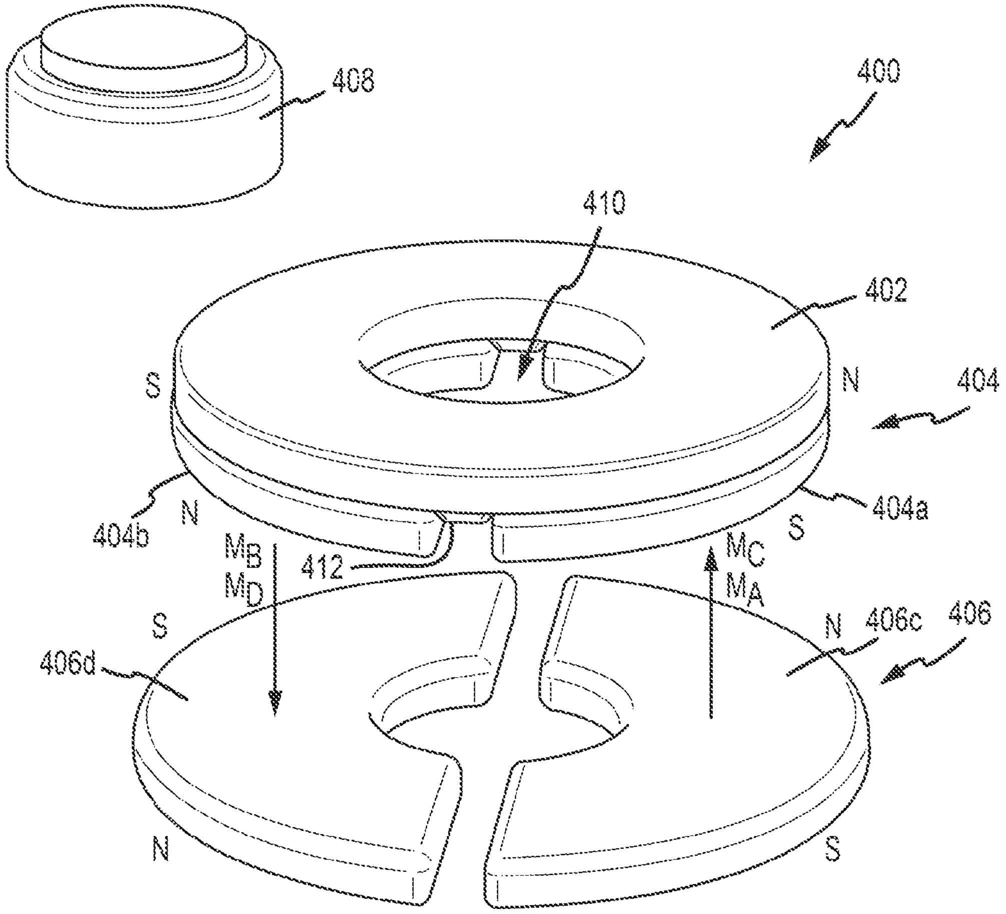
FIG. 4 is perspective view of a reference magnet group incorporating a deflector.

FIG. 4 is perspective view of a reference magnet group 400 incorporating a deflector 402. This configuration of the reference magnet group 400 can be utilized in a transcutaneous bone conduction device having both external and implantable portions. In that regard, external magnet group 404 includes two magnets 404*a*, 404*b* that would be disposed in a housing of an external portion. Implantable magnet group 406 includes two magnets 406*c*, 406*d* that would be disposed in a housing of an implantable portion. In this and other examples of magnet groups depicted herein, the housings and other components of the auditory prosthesis are not depicted for clarity. A battery 408 is generally above the external magnets 404*a*, 404*b* where it is typically located in an auditory prosthesis. The location and orientation of the battery, relative to various magnet groups as described herein is also discussed further below. The deflector 402 in this case, is a soft magnetic component such as soft iron or Permalloy, which is utilized to channel magnetic flux between the two external magnets 404*a*, 404*b*. Utilization of a deflector 402 also helps reduce the stray magnetic flux which can cause interference to components. In the depicted embodiment, the deflector 402 bridges a gap 410 between the external magnets 404*a*, 404*b*. Ribs 412 can extend from the deflector 402 so as to extend into the gap 410 therebetween.

In this and subsequent figures, magnetization directions are depicted as single arrows for clarity. Magnetization direction is an indication of the direction of the magnetic field which is, of course, not limited to a single vector extending from a discrete point on a magnet, but instead extends generally through the body of a magnet, dispersed along the entire area thereof. Here, the magnetization directions $M_A$, $M_C$ of magnets 404*a*, 406*c* are substantially aligned with each other, indicating that the north poles N of both magnets 404*a*, 406*c* are disposed proximate upper portions thereof, while the south poles S are disposed proximate lower portions thereof. As such, the magnetization directions $M_A$ $M_C$ of magnets 404*a*, 406*c* can be described as substantially parallel and harmonized with each other. Similarly, the magnetization directions $M_B$, $M_D$ of magnets 404*b*, 406*d* are substantially aligned with each other, indicating that the north poles N of both magnets 404*b*, 406*d* are disposed proximate lower portions thereof, while the south poles S are disposed proximate upper portions thereof. As such, the magnetization directions $M_B$, $M_D$ of magnets 404*b*, 406*d* can be described as substantially parallel and harmonized with each other. The magnetization directions $M_A$, $M_C$, and $M_B$, $M_D$, however, can be characterized as being substantially parallel and opposed.

The configuration and performance characteristics of the magnet group 400 depicted herein, is a reference against which to compare the characteristics of other magnet groups depicted herein and those not necessarily described, but consistent with the disclosures herein. These performance characteristics include retention force, which is an indication of the mutual attraction force between external and implantable magnets, and battery force, which is an indication of the force exerted on the metal casing of a battery by the magnets. Too weak of a retention force can cause the external portion to fall off undesirably, while too strong of a retention force can cause discomfort or skin necrosis. With regard to battery force, a low battery force is described since high loads will preload a suspension spring upon which the battery and sound processor are mounted. This makes for a less effective vibration isolator. Other performance characteristics, such as interference of the stray field with electronic components in the sound processor, can also be improved with utilization of magnet groups such as those described herein, but are not necessarily discussed in detail.

Figure 5A:
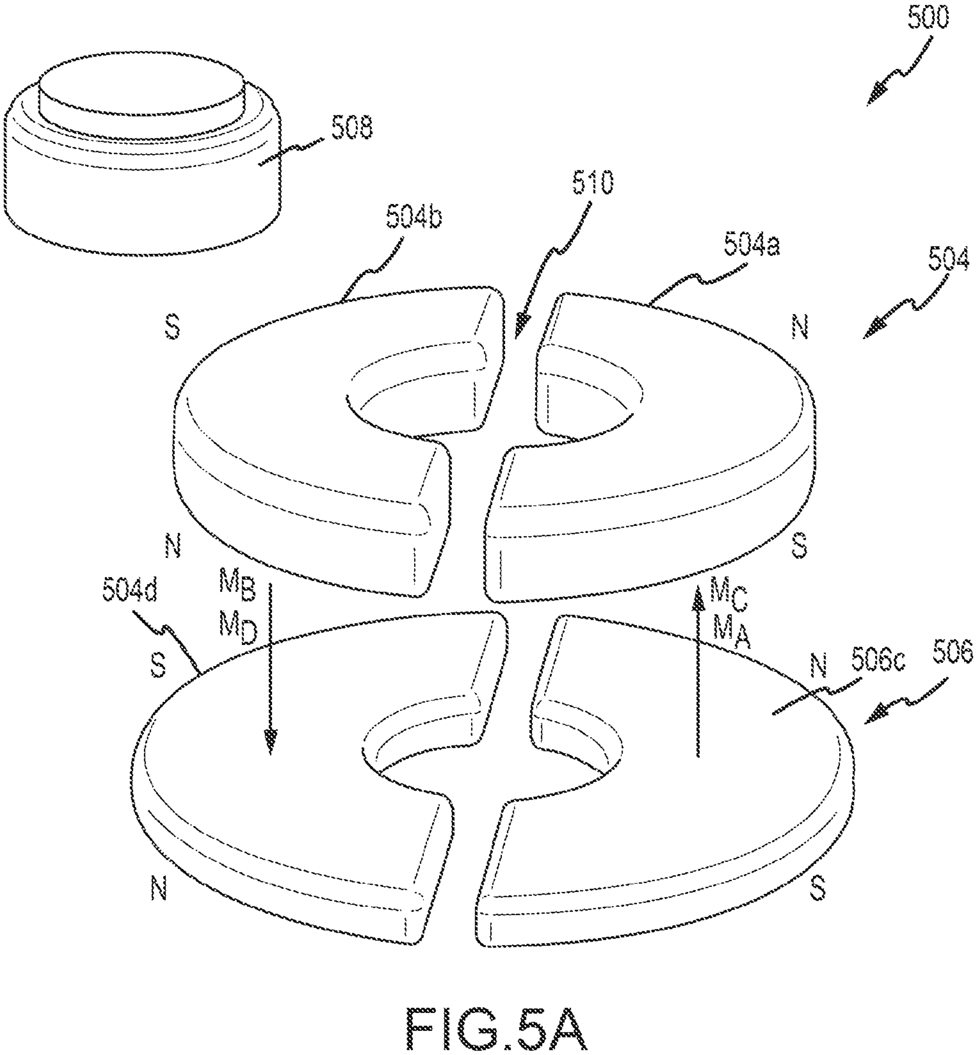
FIG. 5A is a perspective view of the reference magnet group of FIG. 4 without utilizing the deflector.
Figure 5B:
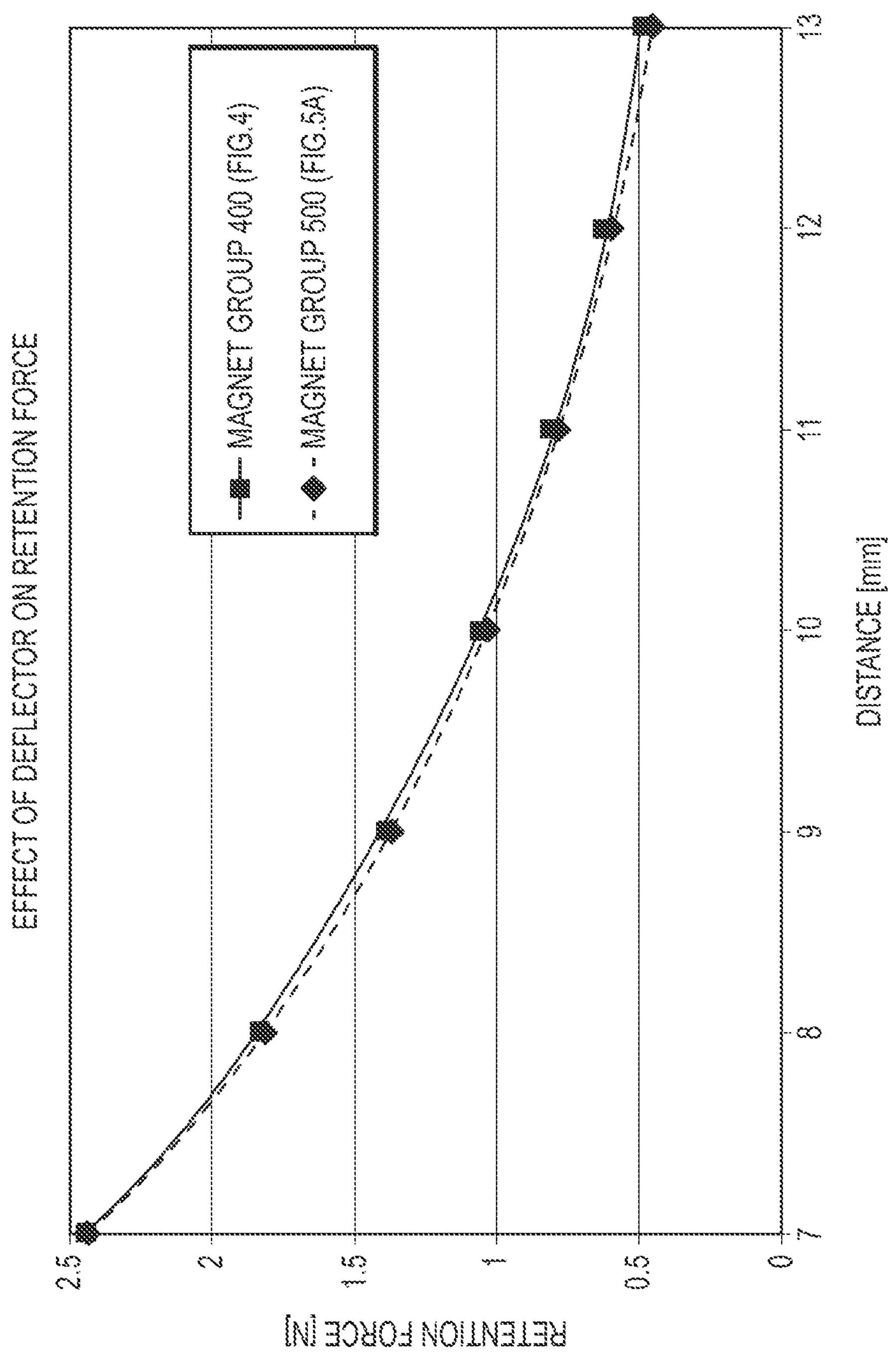
FIG. 5B is a plot showing retention force for the magnet group with the deflector of FIG. 4, as compared to the magnet group without deflector of FIG. 5A.
Figure 5C:
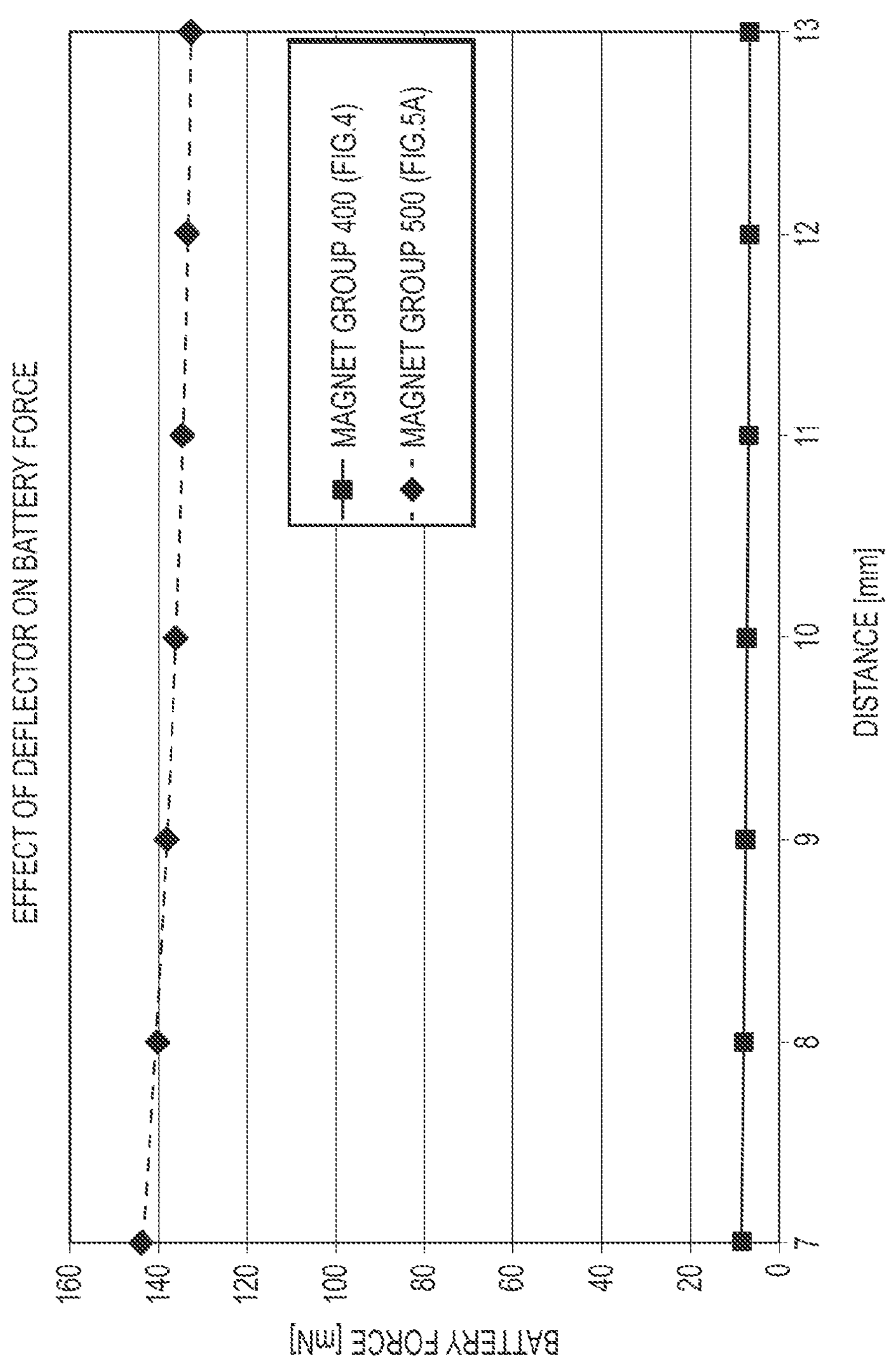
FIG. 5C is a plot showing battery force for the magnet group with the deflector of FIG. 4, as compared to the magnet group without deflector of FIG. 5A.

FIG. 5A is a perspective view of the reference magnet group 400 of FIG. 4, but without the presence of the deflector 402. The heights of magnet 504*a* and 504*b* are the same as the overall heights of magnets 404*a* or 404*b* and deflector plate 402 (depicted in FIG. 4). Thus, when comparing different magnet configurations, this is done for the same characteristic dimensions of height and diameter. In that case, the magnet group of FIG. 5A is depicted as magnet group 500 and not all elements thereof are necessarily described further. Moreover, the components are generally numbered consistently with the components of FIG. 4, beginning with 500. FIG. 5B is a plot showing retention force for the magnet group 400 (with the deflector 402) of FIG. 4, as compared to the magnet group 500 of FIG. 5A (without a deflector). On the horizontal scale, the distance between an external magnet group (e.g., magnet group 404) and an implantable magnet group (e.g., magnet group 406) is depicted. This distance can vary from recipient to recipient based on the thickness of the skin flap on the head, implantation depth, etc. As can be seen, the retention force of magnet group 400 is comparable to that of magnet group 500, across a range of separation distances. As such, it can be confirmed that the deflector 402 has little effect on retention force. FIG. 5C is a plot showing battery force for the magnet group 400 (with the deflector 402) of FIG. 4, as compared to the magnet group 500 of FIG. 5A (without a deflector). Across a range of separation distances between the external magnet group and implantable magnet group, however, the difference in battery force is marked, which indicates that utilization of a deflector has a significant effect on battery force. In case of a magnet group without deflector, there is a significant preload on a suspension spring.

Figure 6A:
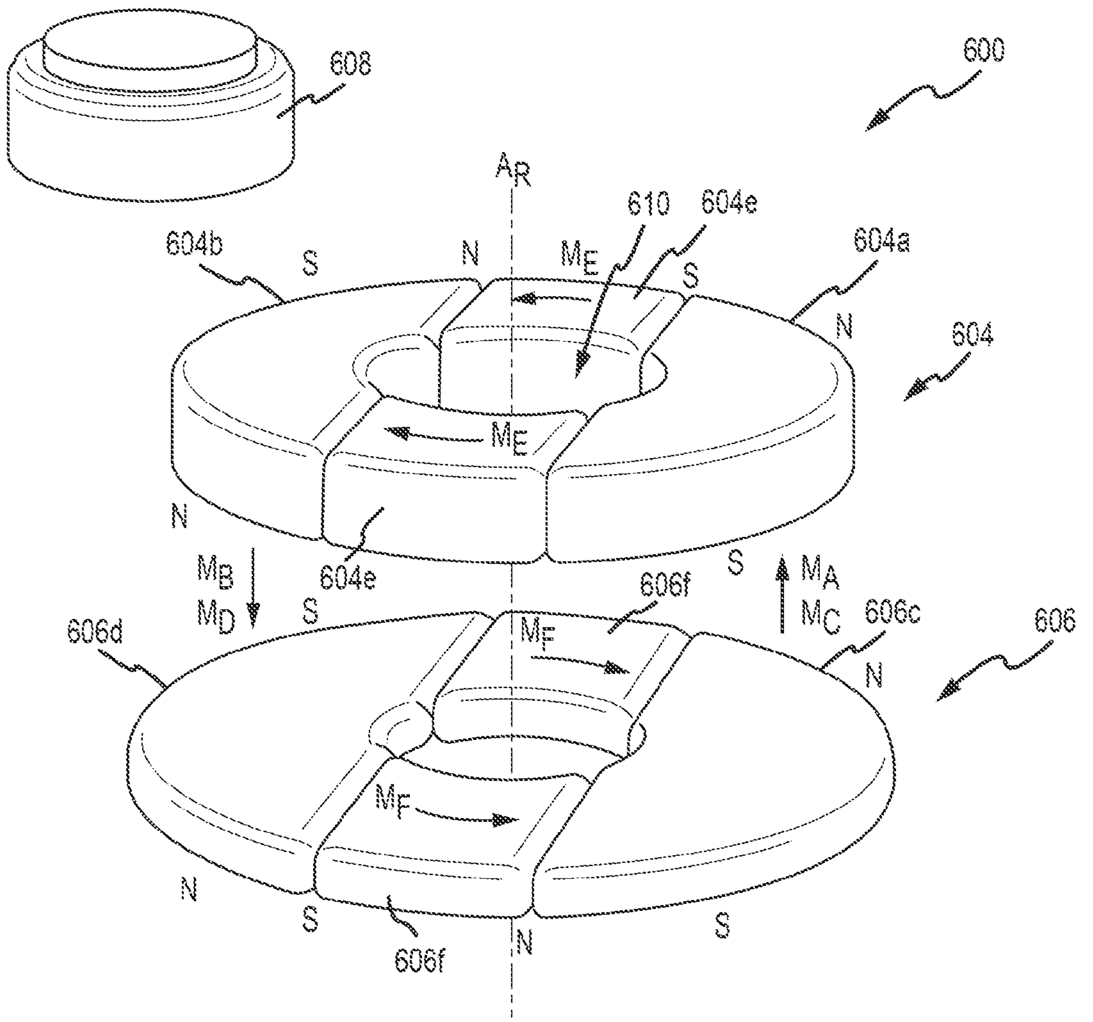
FIG. 6A is a perspective view of a magnet group in accordance with one example of the technology.

FIG. 6A is a perspective view of a magnet group 600 in accordance with one example of the technology. Many of the components are generally numbered consistently with the components of FIG. 4, beginning with 600, and not all elements thereof are necessarily described further. External magnet group includes magnets 604*a* and 604*b*, each having an arced form factor with two straight ends or edges. External magnet group 604 also includes a third magnet 604*e*, disposed between the ends of magnets 604*a* and 604*b*. In the depicted example, the third magnet 604*e* is in two parts, and, in that regard, can be considered to be two discrete magnets, disposed between different ends of magnets 604*a* and 604*b*. In other examples, magnet 604*e* can be configured as a single part, typically defining a gap 610 therein for receipt of a fixation screw 222 (as depicted in FIG. 2). Magnetization direction $M_E$ is depicted, again, in a simplified form as a single vector substantially orthogonal to magnetization directions $M_A$, $M_B$. This magnetization direction $M_E$ indicates that the north pole N of magnet 604*e* is disposed proximate magnet 604*b*, while the south pole S is disposed proximate magnet 604*a*. By orienting the poles as such, magnetic flux of the first magnet 604*a* is diverted more directly to the second magnet 604*b*, via the third magnet 604*e*. Similarly, magnet group 606 also includes a third magnet 606*f*, disposed between magnets 606*c* and 606*d*. In the depicted example, magnet 606*f* is in two parts, but in other examples, magnet 606*f* can be configured as a single part. Magnetization direction $M_F$ is depicted, again, in a simplified form as a single vector substantially orthogonal to magnetization directions $M_C$, $M_D$. This magnetization direction $M_F$ indicates that the north pole N of magnet 606*f* is disposed proximate magnet 606*c*, while the south pole S is disposed proximate magnet 606*d*. By orienting the poles as such, magnetic flux of the first magnet 606*d* is diverted more directly to the second magnet 606*c*, via the third magnet 606*f*. It should be noted that the magnetization directions $M_E$ and $M_F$ are both substantially parallel and opposed to each other.

Figure 6B:
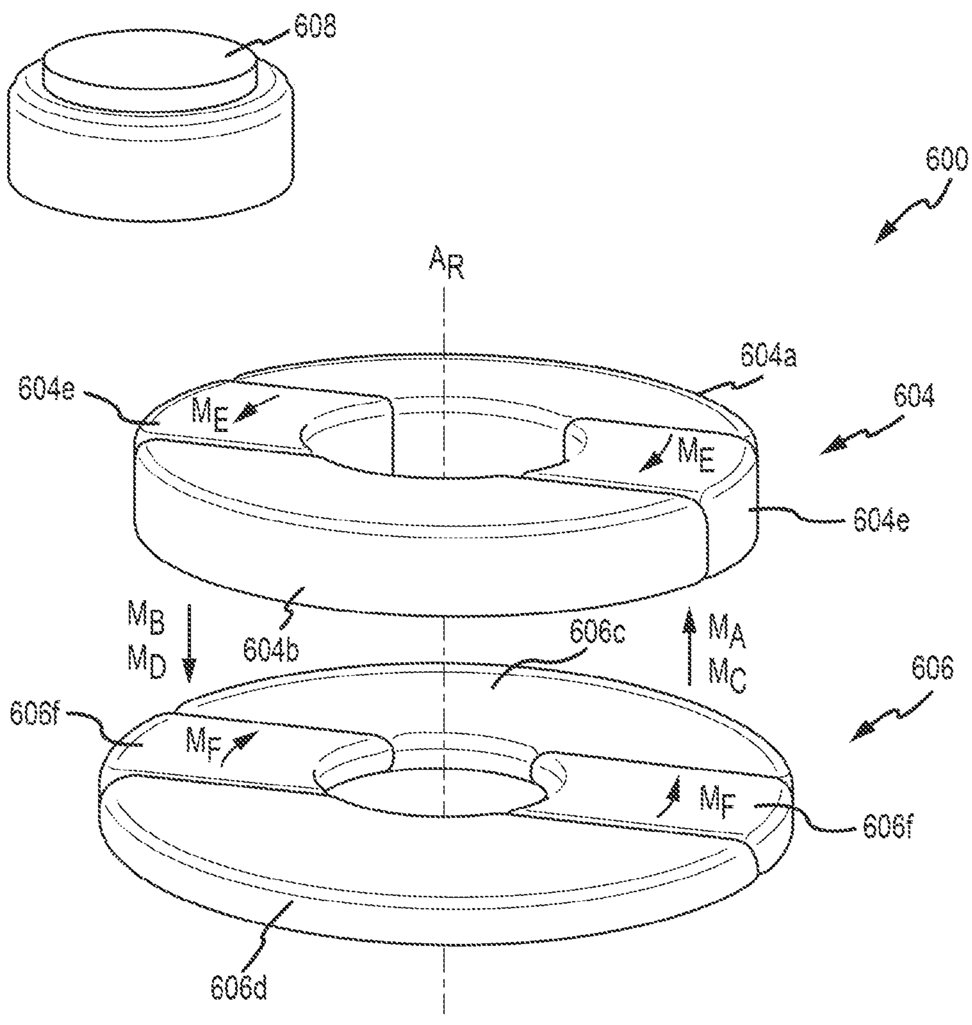
FIG. 6B is a perspective view of the magnet group of FIG. 6A with an altered battery configuration.

FIG. 6B is a perspective view of the magnet group 600' of FIG. 6A with a different battery 608 configuration. The components are generally numbered consistently with the components of FIG. 6A, and not all elements thereof are necessarily described further. Notably, the relative position of the battery 608 and magnet group 600' has changed, although the absolute separation between the battery 608 and the magnet group (determined from the axis of rotational symmetry $A_R$) remains the same. The battery 608 shown in FIG. 6B is disposed adjacent the third magnet 604*e*. This battery position is beneficial to achieve a low battery force.

The magnets 604*a*, 604*b*, 604*e* of the external magnet group are disposed in a circuit that defines a substantially continuous flux path through the external component. Magnetic flux is channeled along the flux path following the magnetization direction of the respective magnets: from the first end magnet 604*a*, through the intermediate third magnet 604*e*, to the second end magnet 604*b*. This reduces the incidence of stray magnetic flux adjacent the intermediate magnet 604*e* where the battery 608 is positioned in FIG. 6B.

Figure 6C:
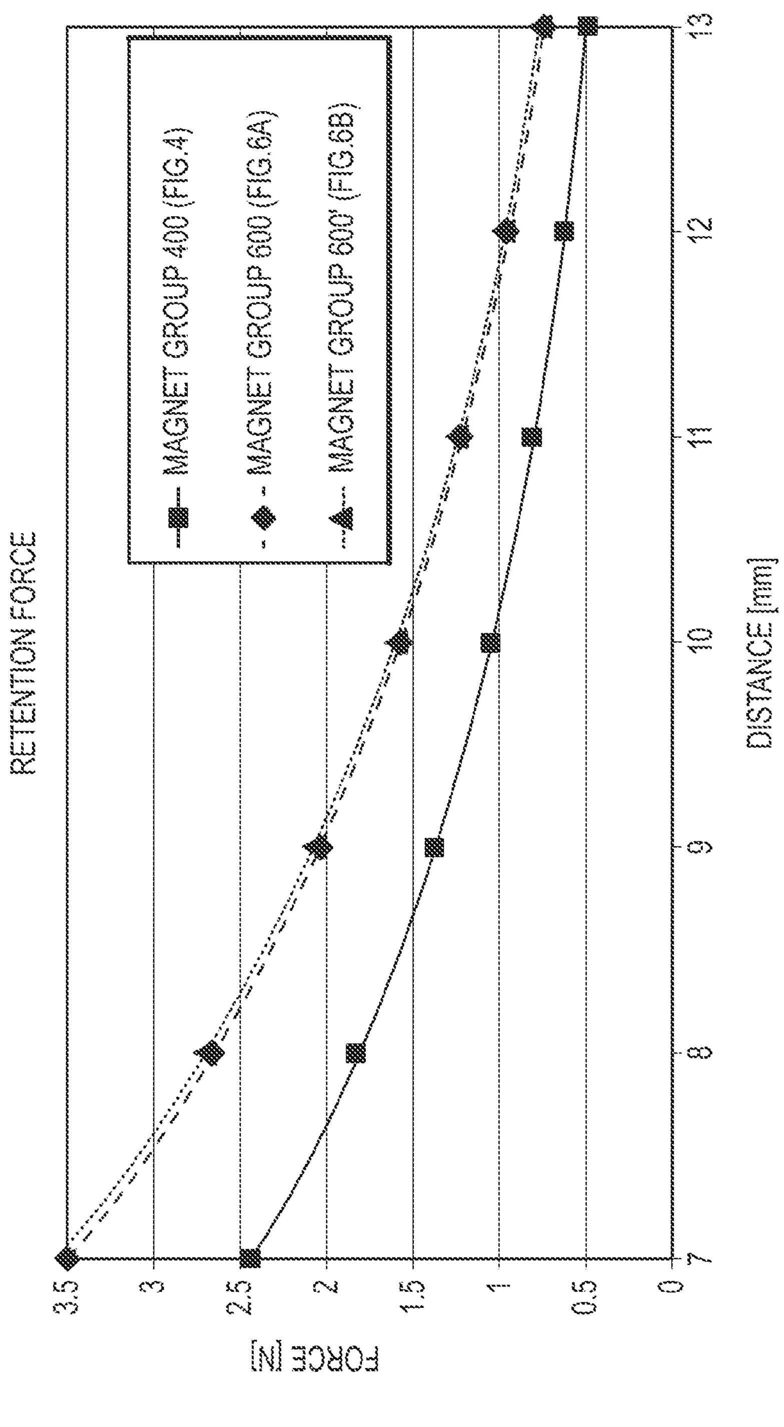
FIG. 6C is a plot showing retention force for the magnet group with the deflector of FIG. 4, as compared to the magnet groups of FIGS. 6A and 6B.
Figure 6D:
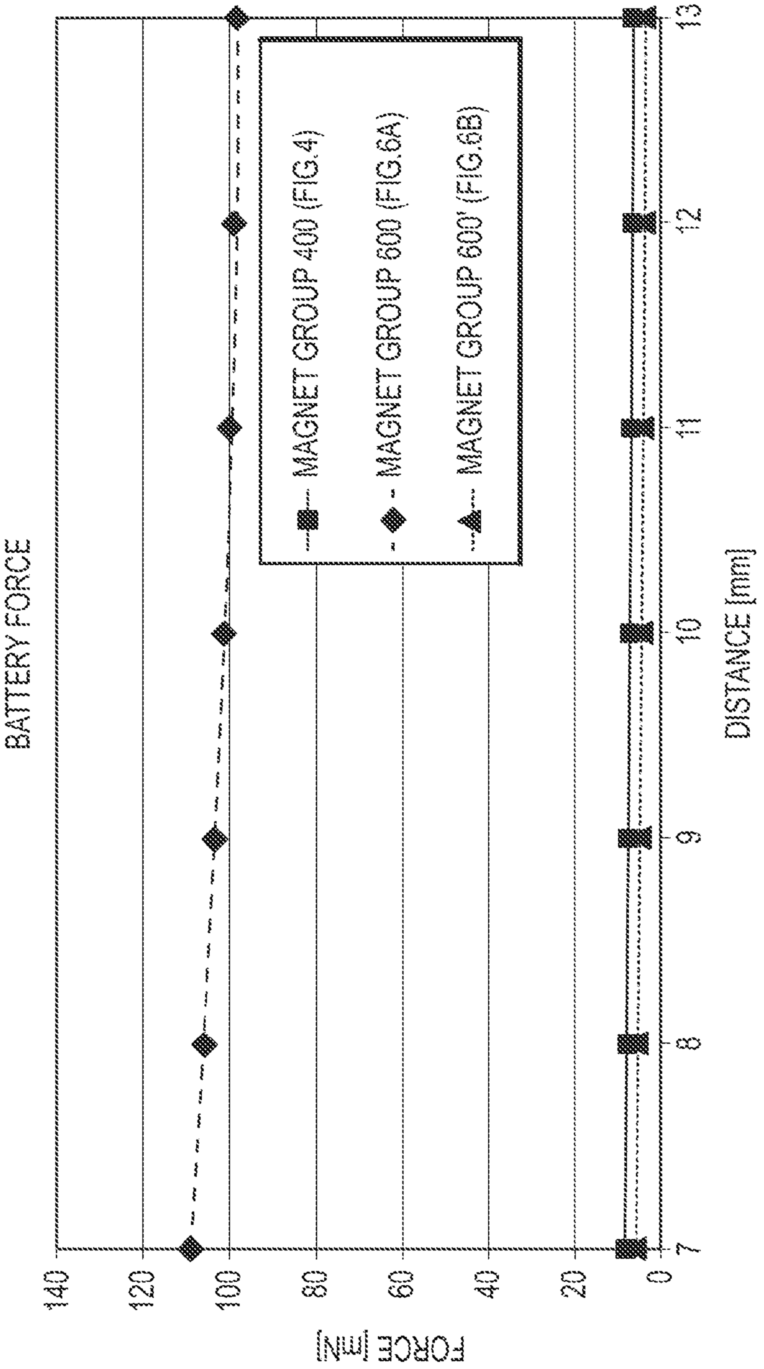
FIG. 6D is a plot showing battery force for the magnet group with the deflector of FIG. 4, as compared to the magnet groups of FIGS. 6A and 6B.

FIG. 6C is a plot showing retention force for the magnet group 400 with the deflector of FIG. 4, as compared to the magnet groups 600, 600' of FIGS. 6A and 6B, respectively. From this graph, the increase on magnet retention force resulting from the use of additional magnets (e.g., magnets 604*e*, 606*f*) is clear, regardless of the orientation of the battery. As such, this increase in retention force can allow comparatively smaller magnets to be used which can reduce the overall size of the external and implantable portion of the auditory prosthesis. FIG. 6D is a plot showing battery force for the magnet group 400 (with the deflector) of FIG. 4, as compared to the magnet groups 600, 600' of FIGS. 6A and 6B, respectively. Noticeably here, battery force of the magnet group 600' of FIG. 6B is consistent with that of the reference magnet group 400 of FIG. 4, while the battery force of magnet group 600 of FIG. 6A differs significantly. This indicates that the configuration of magnet group 600 (and the associated battery) is less desirable.

Figure 7A:
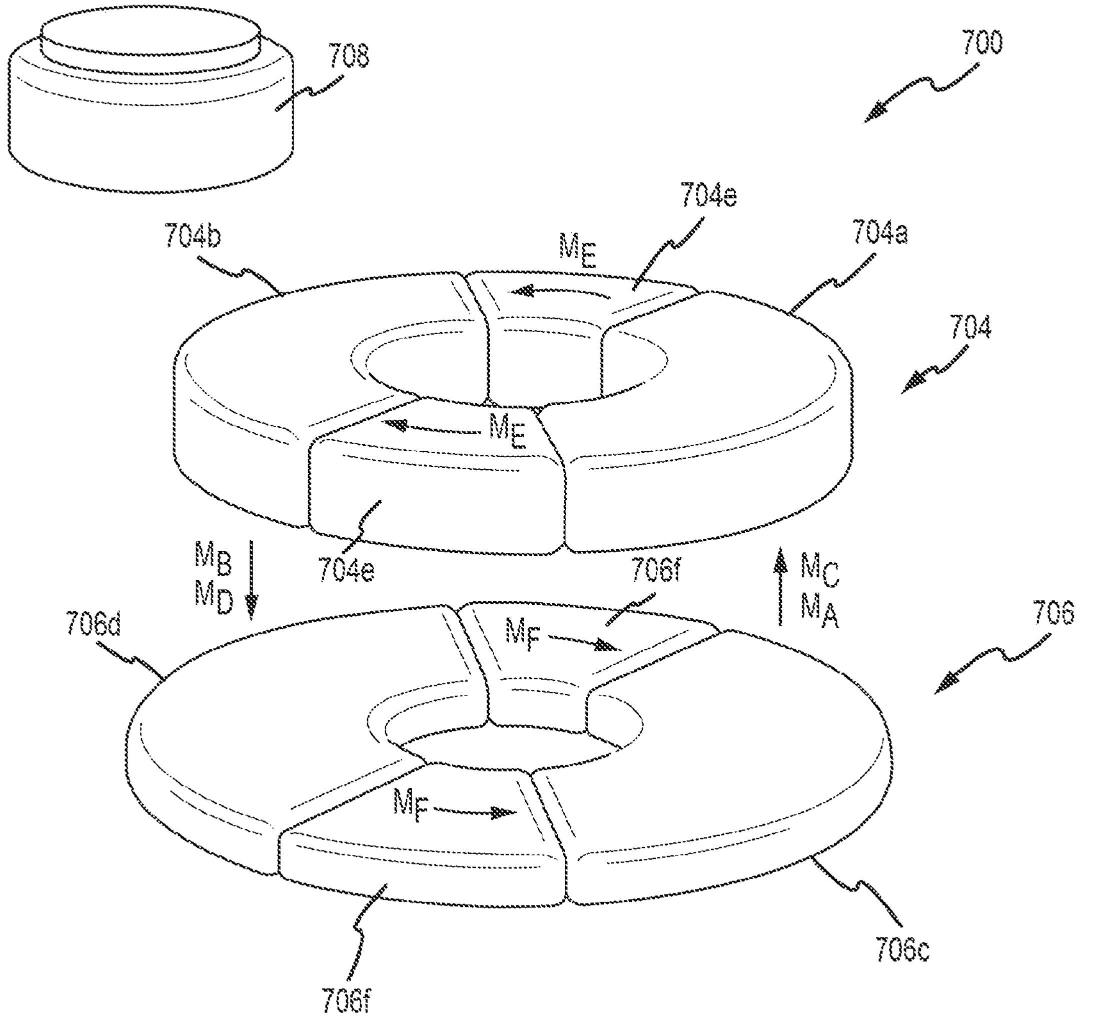
FIG. 7A is a perspective view of a magnet group in accordance with another example of the technology.
Figure 7B:
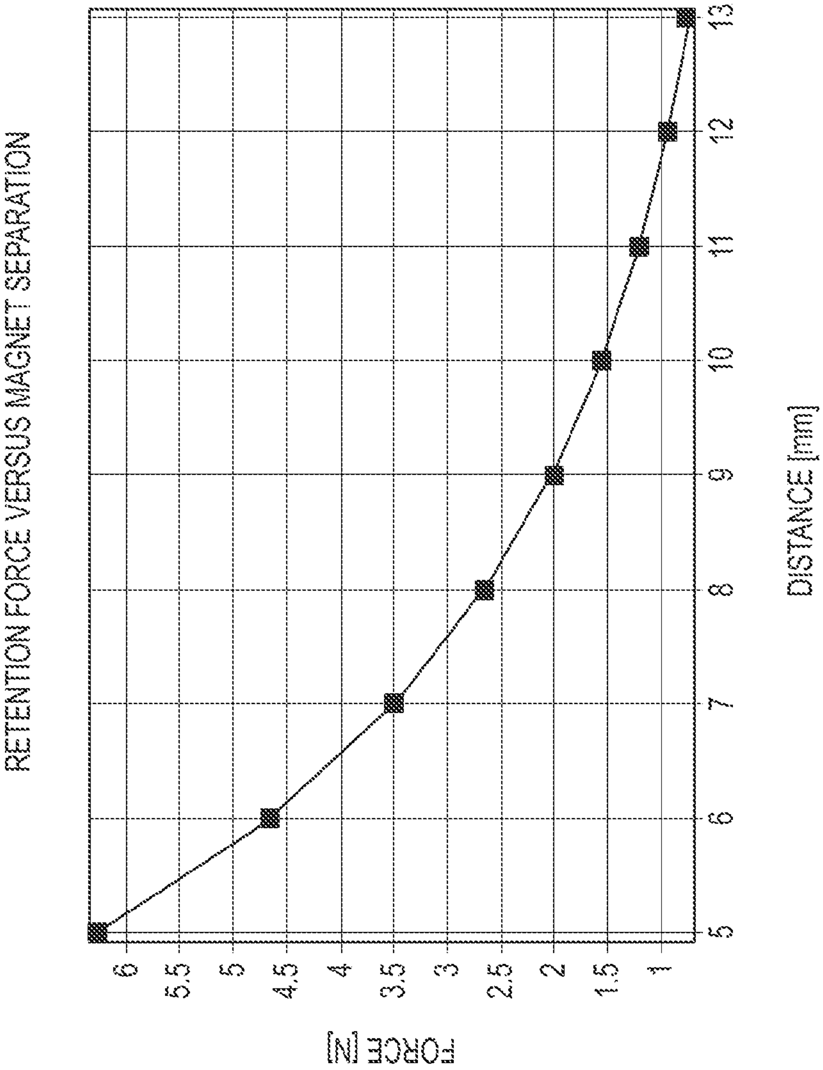
FIG. 7B is a plot showing retention force versus magnet separation for the magnet group of FIG. 7A.
Figure 7C:
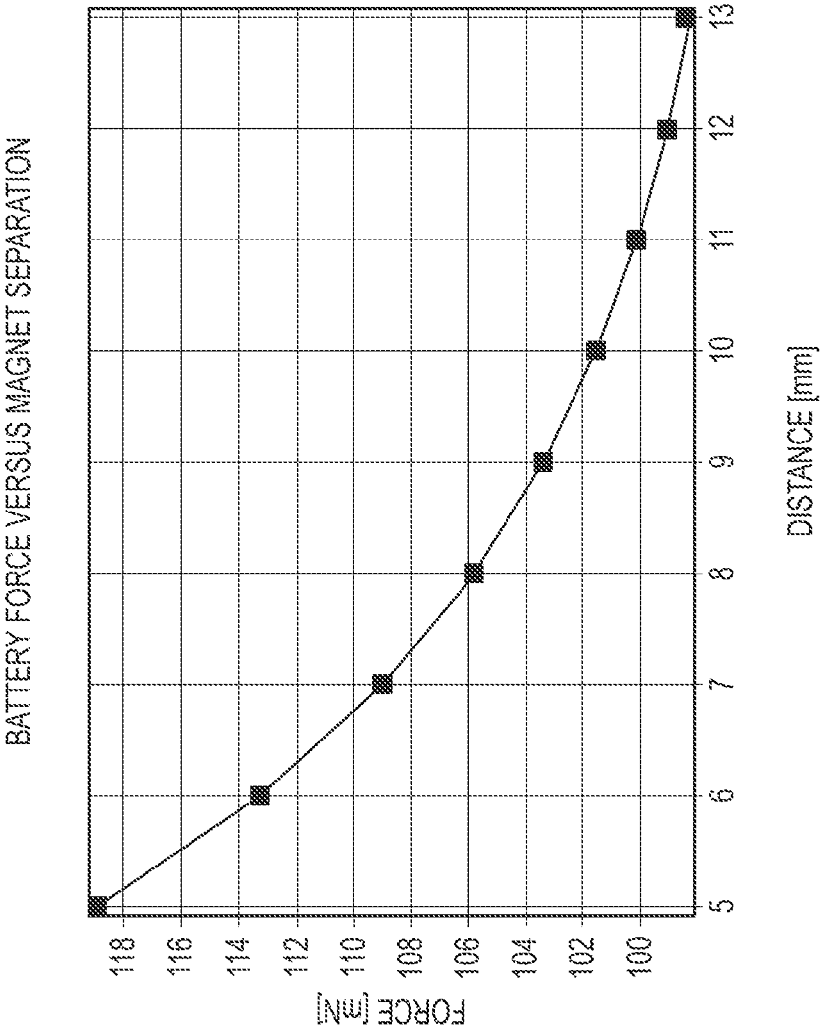
FIG. 7C is a plot showing battery force versus magnet separation for the magnet group of FIG. 7A.

FIG. 7A is a perspective view of a magnet group 700 in accordance with another example of the technology. Many of the components are generally numbered consistently with the components of FIG. 6A, but beginning with 700, and not all elements thereof are necessarily described further. Magnet group 704 also includes a third magnet 704*e* that includes two discrete magnets, disposed between magnets 704*a* and 704*b*. Similarly, magnet group 706 also includes a third magnet 706*f*, disposed between magnets 706*c* and 706*d*. Here, magnets 704*e* and 706*f* are substantially wedge-shaped. FIG. 7B is a plot showing retention force versus magnet separation for the magnet group 700 of FIG. 7A. FIG. 7C is a plot showing battery force versus magnet separation for the magnet group 700 of FIG. 7A. The forces plotted in both are based on a separation distance of the external and implantable magnet groups 704, 706, and are compared to plots depicted in FIGS. 8B and 8C below.

Figure 8A:
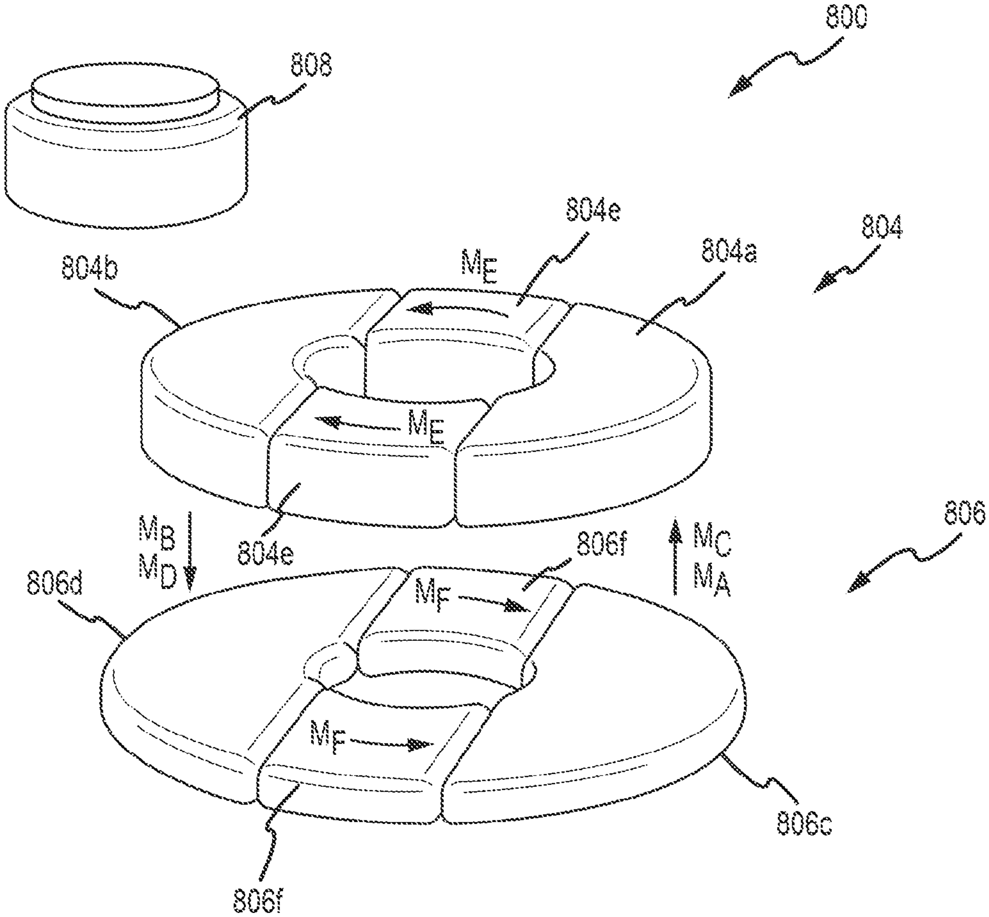
FIG. 8A is a perspective view of a magnet group in accordance with another example of the technology.
Figure 8B:
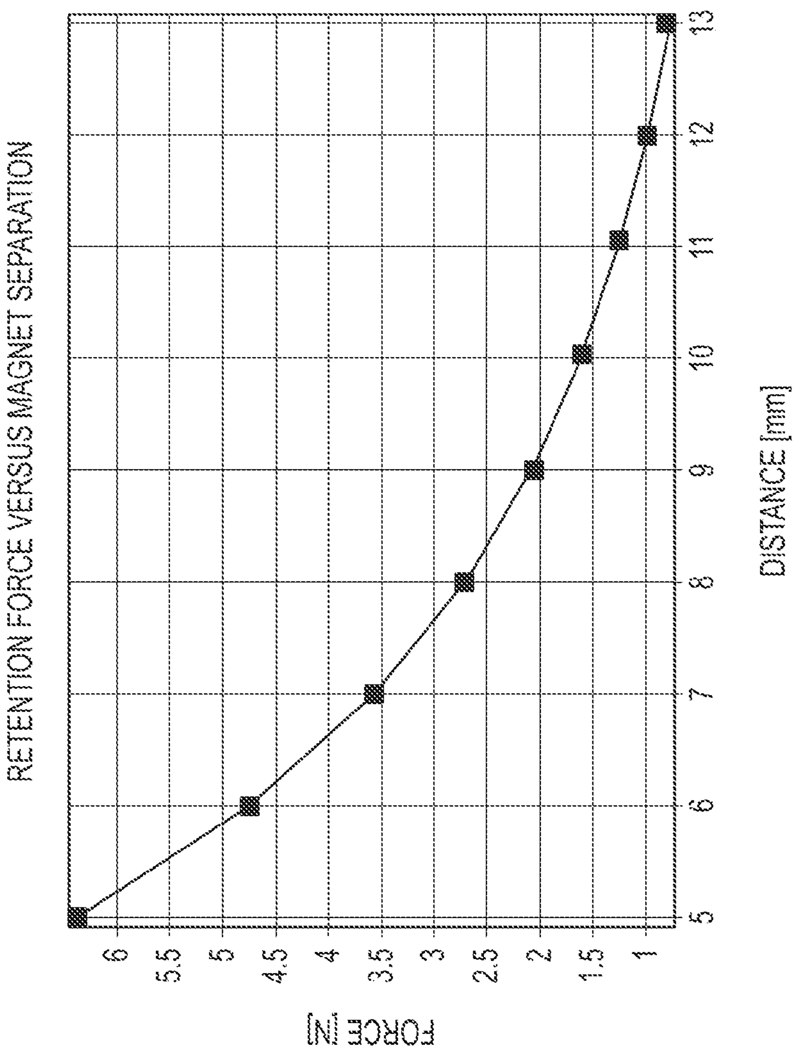
FIG. 8B is a plot showing retention force versus magnet separation for the magnet group of FIG. 8A.
Figure 8C:
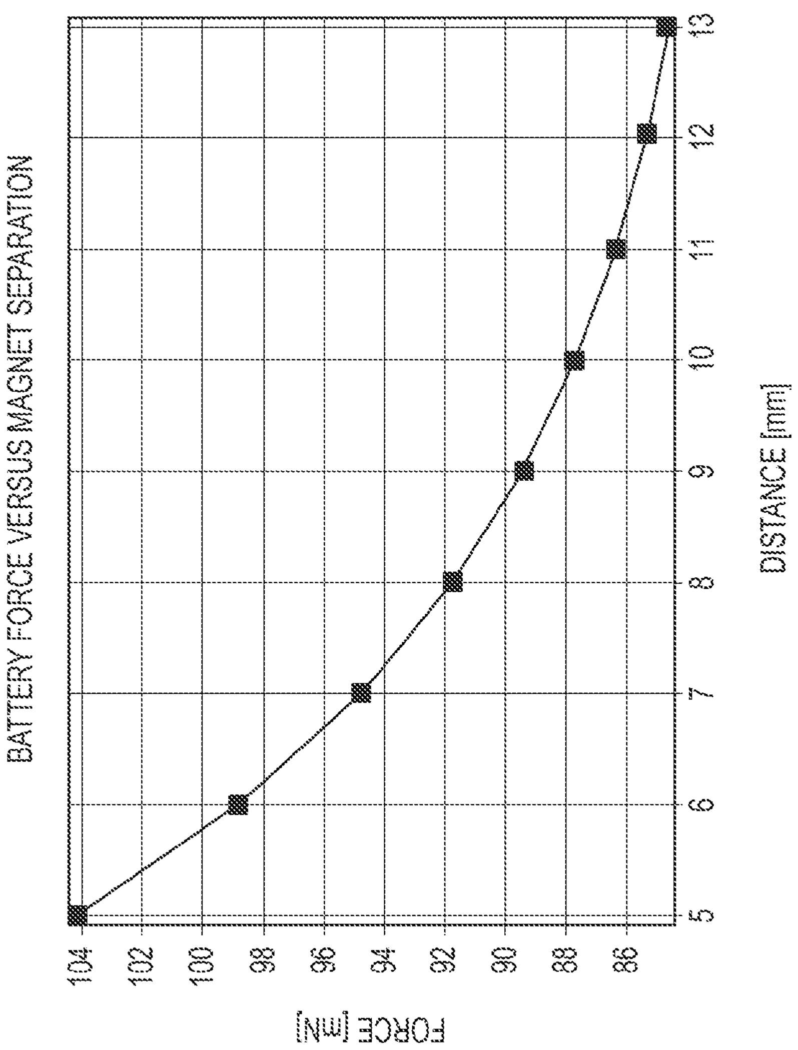
FIG. 8C is a plot showing battery force versus magnet separation for the magnet group of FIG. 8A.

FIG. 8A is a perspective view of a magnet group 800 in accordance with another example of the technology. This magnet group 800 is identical to the magnet group 600 depicted FIG. 6A and thus not all elements thereof are necessarily described further. Here, magnets 804*e* and 806*f* are substantially trapezoidal. FIG. 8B is a plot showing retention force versus magnet separation for the magnet group 800 of FIG. 8A. This plot presents the same information as the plot of retention force versus magnet separation for the magnet group 600, as depicted in FIG. 6A. As compared to the plots of FIGS. 7B and 7C, it can be concluded that the shapes of the diametrically magnetized third magnets (e.g., 704*e*, 706*f* in FIG. 7A; and 804*e*, 806*f* in FIG. 8A) are not critical. FIG. 8C is a plot showing battery force versus magnet separation for the magnet group 800 of FIG. 8A. This plot presents the same information as the plot of battery force versus magnet separation for the magnet group 600, as depicted in FIG. 6A. The reduced battery force depicted in FIG. 8C indicates that the configuration of magnet group 800 might be slightly more desirable than that of magnet group 700.

Figure 9A:
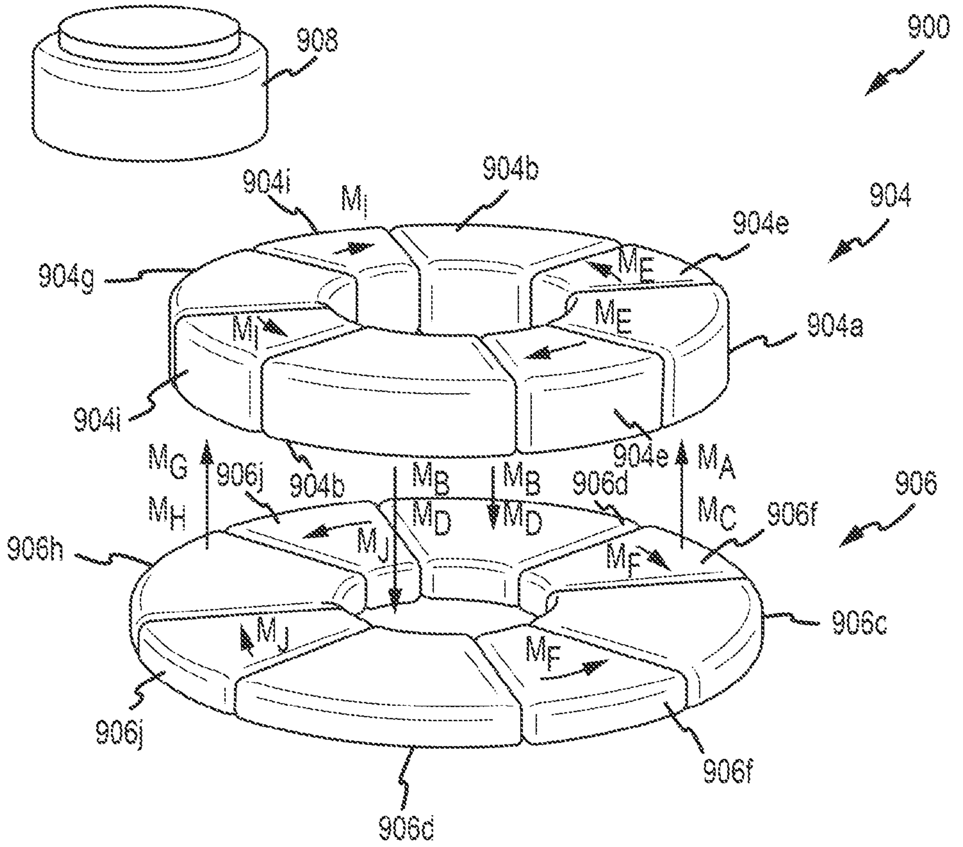
FIG. 9A is a perspective view of a magnet group in accordance with another example of the technology.
Figure 9B:
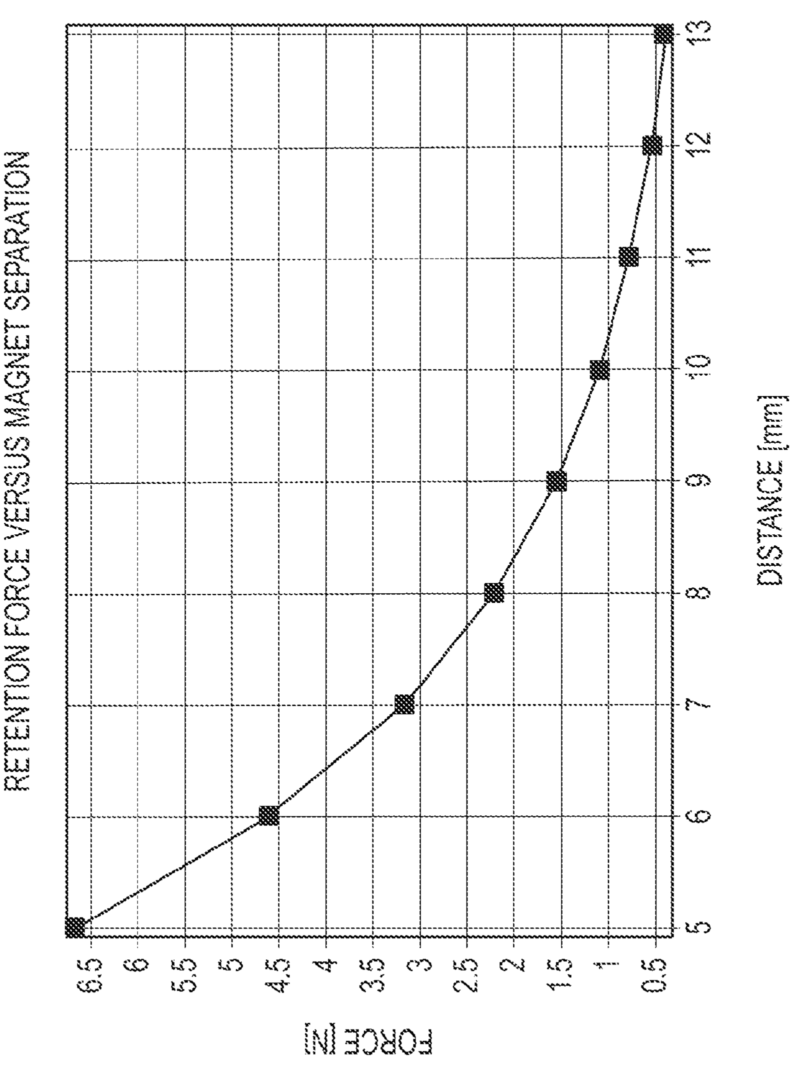
FIG. 9B is a plot showing retention force versus magnet separation for the magnet group of FIG. 9A.
Figure 9C:
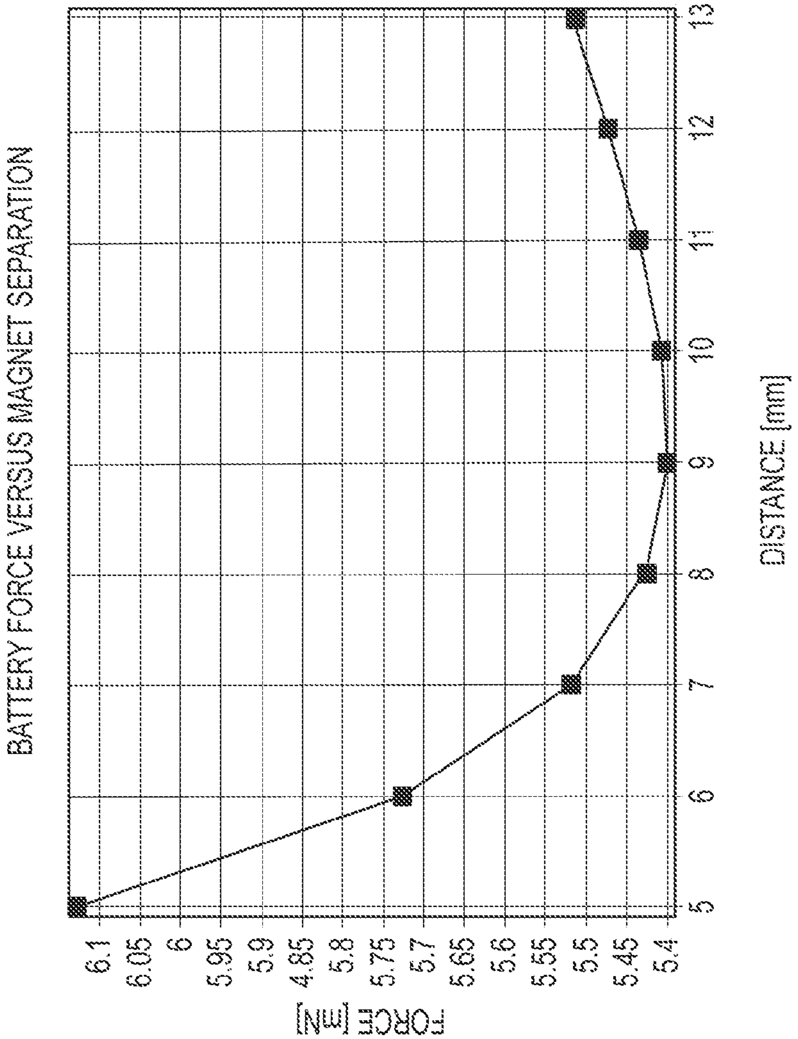
FIG. 9C is a plot showing battery force versus magnet separation for the magnet group of FIG. 9A.

FIG. 9A is a perspective view of a magnet group 900 in accordance with another example of the technology. External magnet group 904 includes axially magnetized magnets 904*a*, 904*b* (in two parts), and 904*g*. Additionally, diametrically magnetized magnets 904*e* and 904*i* (both in two parts) are depicted. Implantable magnet group 906 includes axially magnetized magnets 906*c*, 906*d* (in two parts), and 906*h*. Additionally, diametrically magnetized magnets 906*f* and 906*j* (both in two parts) are depicted. Similarly referenced magnetization directions are also indicated. FIG. 9B is a plot showing retention force versus magnet separation for the magnet group 900 of FIG. 9A. As compared to the retention force plots of FIGS. 7B and 8B, the increased number of magnets depicted in FIG. 9A results in only slight improvement to retention force at shorter separation distances. Retention force at greater separation distances is worse. FIG. 9C is a plot showing battery force versus magnet separation for the magnet group 900 of FIG. 9A. Notably, battery force shows a significant overall decrease, as compared to the battery forces depicted in FIGS. 7C and 8C of magnet group 900. This indicates that the use of more magnets leads to a marked decrease in battery force.

Figure 10A:
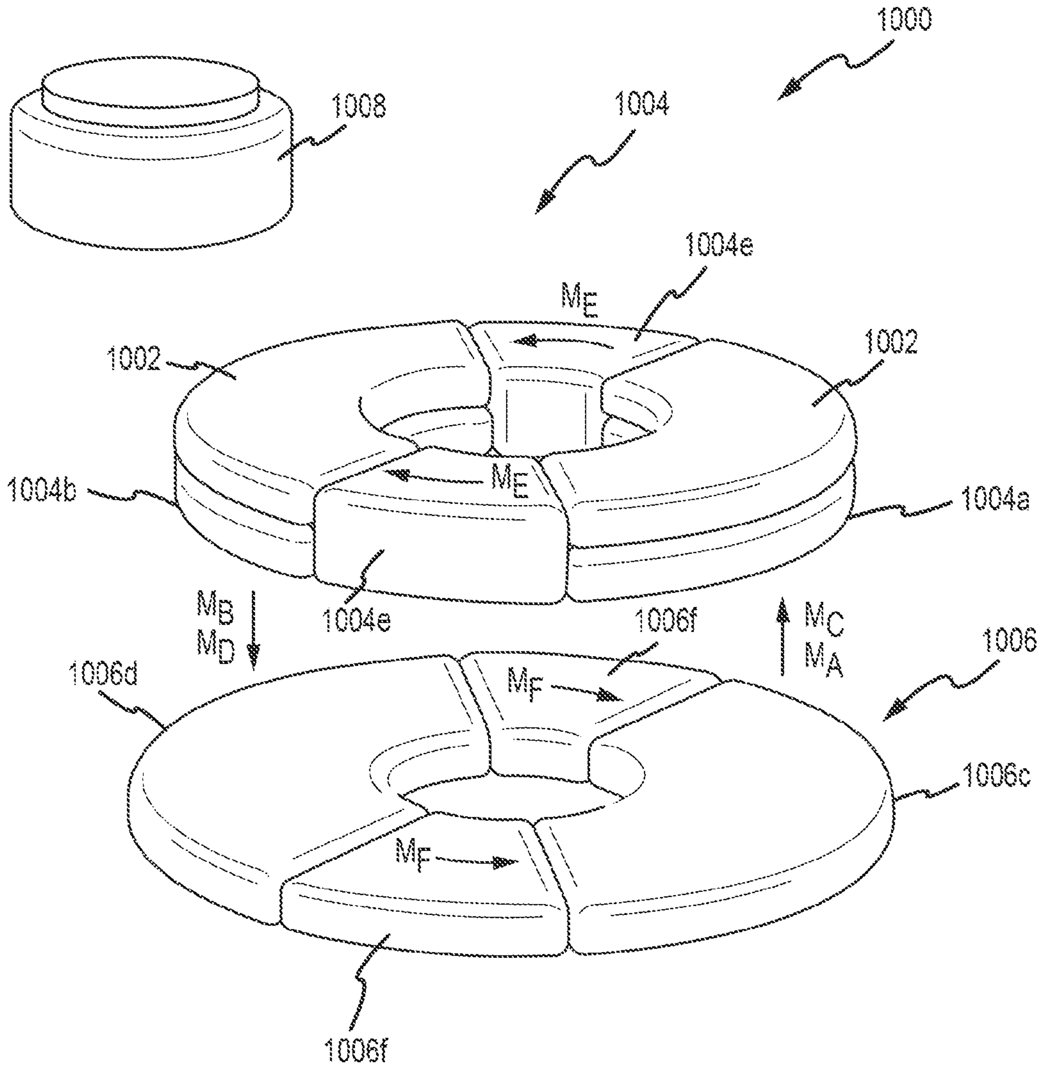
FIG. 10A is a perspective view of a magnet group in accordance with another example of the technology.
Figure 10B:
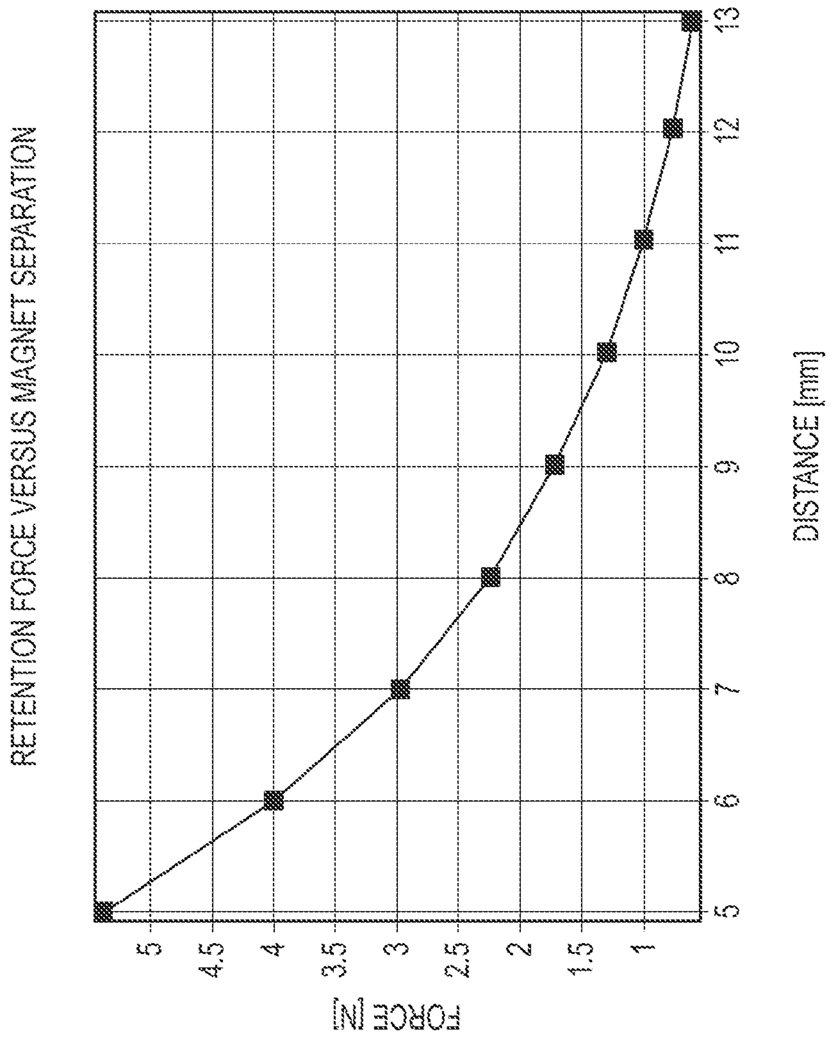
FIG. 10B is a plot showing retention force versus magnet separation for the magnet group of FIG. 10A.
Figure 10C:
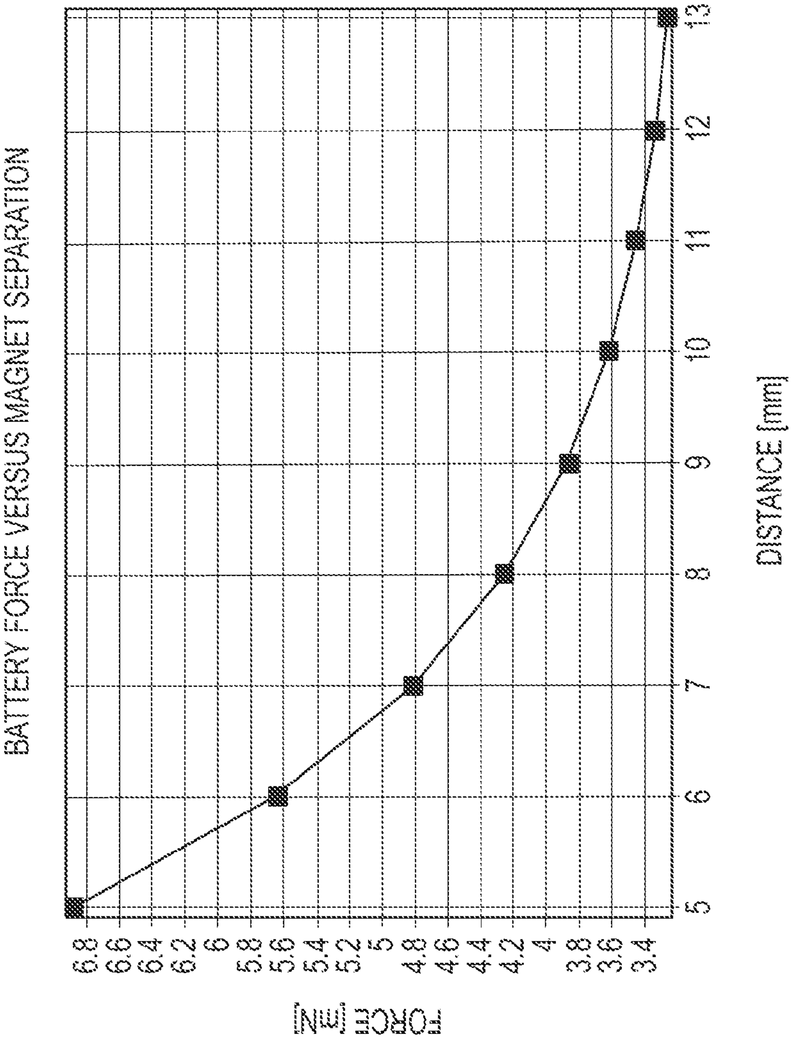
FIG. 10C is a plot showing battery force versus magnet separation for the magnet group of FIG. 10A.

FIG. 10A is a perspective view of a magnet group 1000 in accordance with another example of the technology. Many of the components are generally numbered consistently with the components of FIG. 7A, but beginning with 1000, and not all elements thereof are necessarily described further. Notably here, a deflector 1002 is disposed above magnets 1004*a* and 1004*b*. FIG. 10B is a plot showing retention force versus magnet separation for the magnet group 1000 of FIG. 10A. As compared to the retention force plots of FIGS. 7B and 8B, use of a deflector somewhat lowers retention force, mostly for a small separation distance. FIG. 10C is a plot showing battery force versus magnet separation for the magnet group 1000 of FIG. 10A. As compared to the battery force plots of FIGS. 7C and 8C, use of a deflector significantly lowers the battery force, to values even lower than the reference magnet group 400 incorporating a deflector. Thus use of the deflector may be desirable for cases where it is not possible to locate the battery at a favorable position as in FIG. 6B.

Figure 11A:
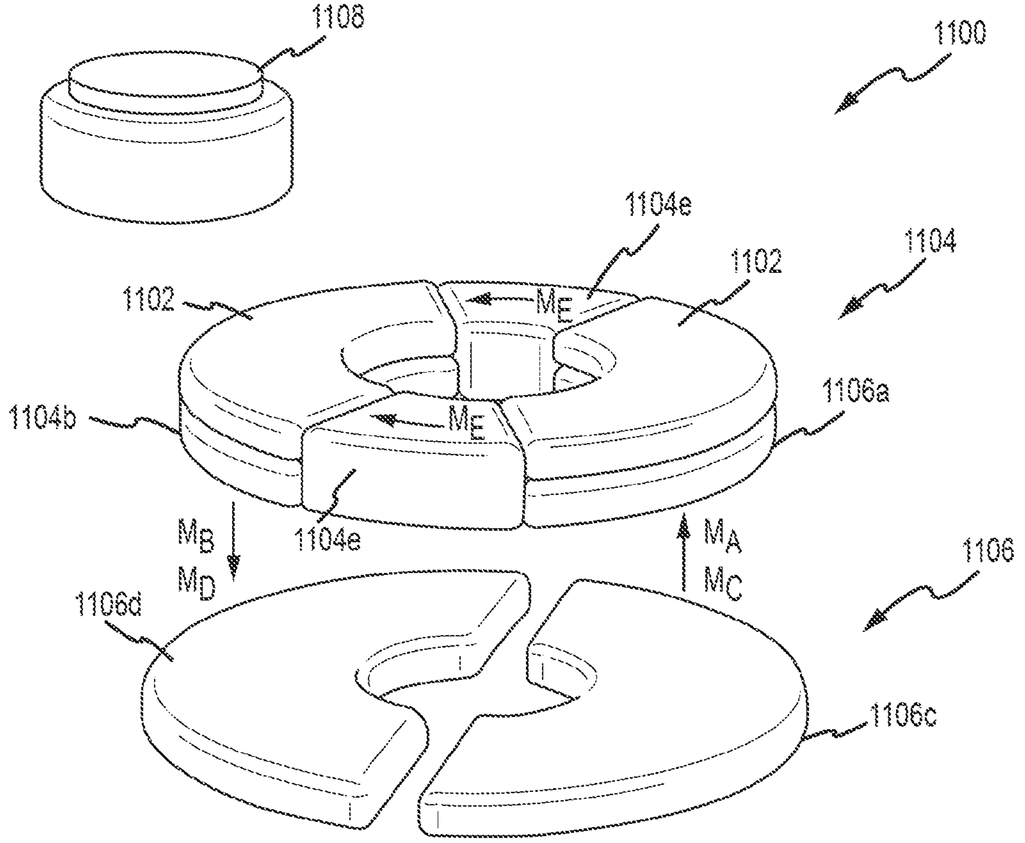
FIG. 11A is a perspective view of a magnet group in accordance with another example of the technology.
Figure 11B:
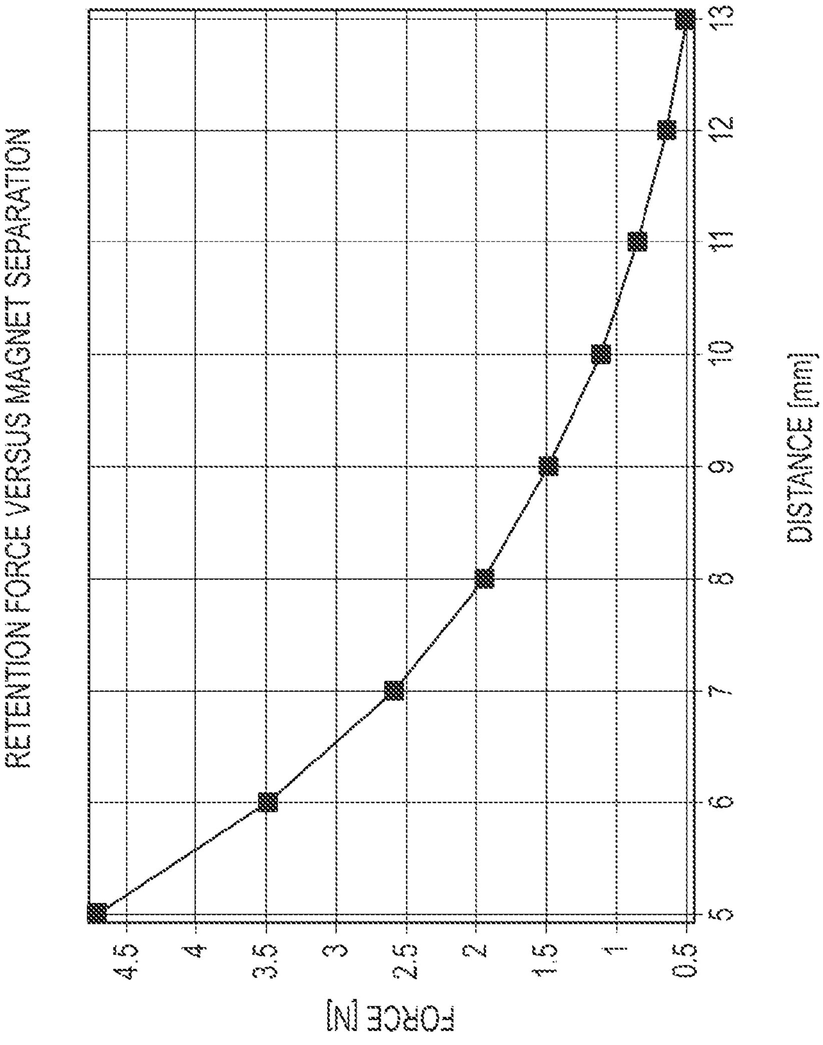
FIG. 11B is a plot showing retention force versus magnet separation for the magnet group of FIG. 11A.
Figure 11C:
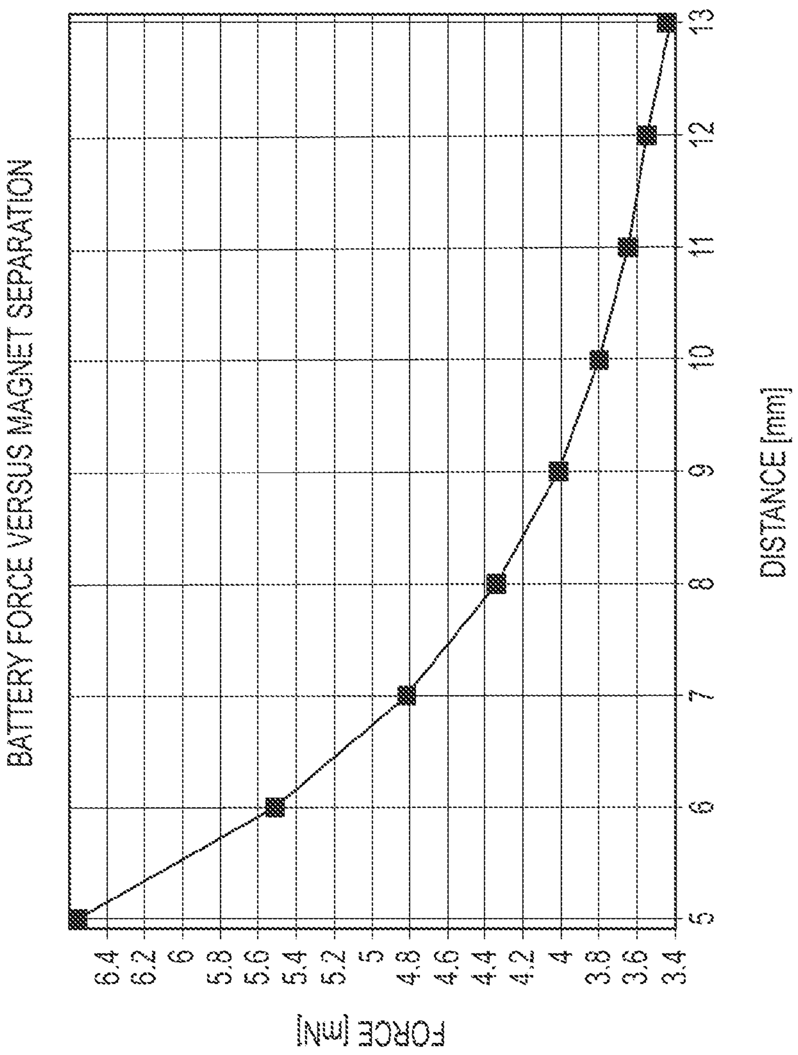
FIG. 11C is a plot showing battery force versus magnet separation for the magnet group of FIG. 11A.

FIG. 11A is a perspective view of a magnet group 1100 in accordance with another example of the technology. In this example, external magnet group 1104 is identical to the magnet group 1004 depicted FIG. 10A and thus not all elements thereof are necessarily described further. Implantable magnet group 1106 is identical to implantable magnet group 406 depicted in FIG. 4 and thus not all elements thereof are necessarily described further. FIG. 11B is a plot showing retention force versus magnet separation for the magnet group 1100 of FIG. 11A. Here, retention force is lowered significantly, indicating that the benefits of magnet groups having greater numbers of magnets can be lost unless such groups are utilized in both the external and implantable magnet groups. Nevertheless, the magnet groups having a greater number of magnets are compatible with currently existing implantable magnet groups having a magnet configuration as 1106 in FIG. 11A. FIG. 11C is a plot showing battery force versus magnet separation for the magnet group 1100 of FIG. 11A. This indicates that battery force is lower than that of the implantable magnet group 400 of FIG. 4.

This disclosure described some embodiments of the present technology with reference to the accompanying drawings, in which only some of the possible embodiments were shown. Other aspects, however, can be embodied in many different forms and should not be construed as limited to the embodiments set forth herein. Rather, these embodiments were provided so that this disclosure was thorough and complete and fully conveyed the scope of the possible embodiments to those skilled in the art.

Although specific embodiments were described herein, the scope of the technology is not limited to those specific embodiments. One skilled in the art will recognize other embodiments or improvements that are within the scope of the present technology. Therefore, the specific structure, acts, or media are disclosed only as illustrative embodiments. The scope of the technology is defined by the following claims and any equivalents therein.

What is claimed is:

1. An apparatus comprising:

a housing; and a magnetic compilation disposed in the housing, the magnetic compilation generating a compilation magnetic field, the magnetic compilation including:

a first magnet portion that generates a first magnetic field;

a second magnet portion that generates a second magnetic field; and a third magnet portion that generates a third magnetic field, wherein each of the first magnet portion, the second magnet portion, and the third magnet portion are arranged so as to reduce a stray magnetic field of the magnetic compilation, wherein the first magnetic field, the second magnetic field, and the third magnetic field define the compilation magnetic field, wherein the apparatus is an auditory prosthesis.

2. The apparatus of claim 1, wherein:

the magnetic compilation is a single element that has multiple polarities.

3. The apparatus of claim 1, wherein the first magnet portion, the second magnet portion and the third magnet portion are a unitary disc, and the first magnet portion and second magnet portion are axially magnetized, and the third magnet portion is diametrically magnetized.

4. The apparatus of claim 1, wherein the first magnet portion, the second magnet portion and the third magnet portion are a unitary part.

5. The apparatus of claim 1, wherein:

the housing is an external housing; and the first magnet portion, the second magnet portion and the third magnet portion are part of a monolithic magnet.

6. The apparatus of claim 1, further comprising:

an implantable housing having located therein a fourth magnet portion, a fifth magnet portion and a sixth magnet portion, the fourth, fifth and sixth magnet portions being respective separate magnets.

7. A medical device comprising one transcutaneous retention magnet that defines a substantially continuous flux path within the medical device, the medical device further comprising an external housing that encloses the retention magnet and an implantable component having a reciprocal group of magnets that forms a transcutaneous coupling with the retention magnet, the group of magnets and the retention magnet forming a closed magnetic circuit.

8. The medical device of claim 7, wherein the retention magnet is configured to produce a flux concentration adjacent a skin barrier.

9. The medical device of claim 7, wherein the retention magnet has a magnetization direction that defines a localized section of the flux path.

10. The medical device of claim 7, wherein the retention magnet comprises:

a first end with a magnetization direction that extends normal to a transcutaneous interface, a second end with a magnetization direction extending parallel to the magnetization directions of the first end in an opposite direction, and an intermediate section that is disposed between the first and second ends, the intermediate section having a magnetization direction that is transverse to magnetization directions of the first and second ends.

11. An apparatus comprising:

an external component of an auditory prosthesis having housing; and a magnet body disposed in the housing, the magnet body consisting of:

a first magnet portion having a first magnetization direction;

a second magnet portion having a second magnetization direction substantially parallel and opposed to the first magnetization direction; and a third magnet portion having a third magnetization direction substantially orthogonal to both the first magnetization direction and the second magnetization direction.

12. The apparatus of claim 11, wherein:

the magnet body is in the form of a rectangle.

13. The apparatus of claim 11, wherein:

the body is a solid body comprising a single magnet.

14. The apparatus of claim 11, wherein:

the first, second and third magnet arrangements respectively comprise single magnets.

15. The apparatus of claim 11, wherein:

the third magnet portion does not have a gap for a fixation screw.

16. The apparatus of claim 11, wherein:

the housing is an implantable housing.

17. The apparatus of claim 1, wherein the apparatus comprises:

an external component including a sound processor and a second housing including a fourth magnet portion including at least one magnet; and an implantable component including the housing, wherein a thickness of the at least one magnet of the fourth magnet portion is greater than a thickness of any of the magnets of the first, second and third magnet portions.

* * * * *